(12) United States Patent
Lee

(10) Patent No.: US 9,087,595 B2
(45) Date of Patent: Jul. 21, 2015

(54) SHIELDING 2-CYCLE HALF-PAGE READ AND PROGRAM SCHEMES FOR ADVANCED NAND FLASH DESIGN

(71) Applicant: Aplus Flash Technology, Inc, Fremont, CA (US)

(72) Inventor: Peter Wung Lee, Saratoga, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 131 days.

(21) Appl. No.: 13/867,051

(22) Filed: Apr. 20, 2013

(65) Prior Publication Data

US 2013/0279251 A1    Oct. 24, 2013

Related U.S. Application Data

(60) Provisional application No. 61/687,227, filed on Apr. 20, 2012.

(51) Int. Cl.

| G11C 16/26 | (2006.01) |
|---|---|
| G11C 16/04 | (2006.01) |
| G11C 11/56 | (2006.01) |
| G11C 16/24 | (2006.01) |
| G11C 16/34 | (2006.01) |

(52) U.S. Cl.
CPC ............ *G11C 16/26* (2013.01); *G11C 16/0408* (2013.01); *G11C 16/0483* (2013.01); *G11C 11/5642* (2013.01); *G11C 16/24* (2013.01); *G11C 16/3427* (2013.01)

(58) Field of Classification Search
CPC ............... G11C 16/26; G11C 16/0483; G11C 16/3427; G11C 16/3418; G11C 16/0416
USPC ..................................... 365/185.03, 185.112
See application file for complete search history.

(56) References Cited

U.S. PATENT DOCUMENTS

| 5,734,609 A | 3/1998 | Choi |
|---|---|---|
| 5,867,429 A | 2/1999 | Chen |
| 6,522,580 B2 | 2/2003 | Chen |
| 6,542,407 B1 | 4/2003 | Chen |
| 6,781,877 B2 | 8/2004 | Cernea |
| 6,807,095 B2 | 10/2004 | Chen |
| 6,847,553 B2 | 1/2005 | Chen |
| 6,870,768 B2 | 3/2005 | Cernea |
| 6,917,542 B2 | 7/2005 | Chen |
| 7,046,548 B2 | 5/2006 | Cernea |
| 7,061,798 B2 | 6/2006 | Chen |
| 7,102,924 B2 | 9/2006 | Chen |
| 7,187,585 B2 | 3/2007 | Li |
| 7,196,928 B2 | 3/2007 | Chen |
| 7,196,946 B2 | 3/2007 | Chen |

(Continued)

*Primary Examiner* — Son Dinh
*Assistant Examiner* — Xiaochun L Chen
(74) *Attorney, Agent, or Firm* — Raywell Group, LLC

(57) ABSTRACT

The present invention provides a two-cycle half-page read scheme by dividing whole NAND array bit lines (BLs) into an odd-BL group and an even-BL group. During the half-plane reading of NAND cells in the odd(even)-BL group, the half-plane even(odd)-BL group acts as the shielding BLs to protect over the odd(even)-BL string reading so that each half-page read operation is substantially reliable and free from BL coupling noise effect. Additionally, each half-page read operation is preferably divided into 3 periods: the first being a bias-condition setup period of the selected WL and remaining control signals; the second being a pre-charge period for all BLs; and the third being a half-page flash data sensing period.

11 Claims, 14 Drawing Sheets

(56) References Cited

U.S. PATENT DOCUMENTS

| | | |
|---|---|---|
| 7,224,613 B2 | 5/2007 | Chen |
| 7,289,344 B2 | 10/2007 | Chen |
| 7,289,348 B2 | 10/2007 | Chen |
| 7,301,808 B2 | 11/2007 | Li |
| 7,301,813 B2 | 11/2007 | Chen |
| 7,301,839 B2 | 11/2007 | Li |
| 7,315,477 B2 | 1/2008 | Chen |
| 7,321,510 B2 | 1/2008 | Li |
| 7,372,730 B2 | 5/2008 | Chen |
| 7,397,698 B2 | 7/2008 | Fong |
| 7,443,729 B2 | 10/2008 | Li |
| 7,499,329 B2 | 3/2009 | Nazarian |
| 7,697,333 B2 | 4/2010 | Isobe |
| 7,965,555 B2 | 6/2011 | Namiki |
| 8,023,327 B2 | 9/2011 | Futatsuyama |
| 8,089,806 B2 | 1/2012 | Takada |
| 8,102,711 B2 | 1/2012 | Maejima |
| 8,154,941 B2 | 4/2012 | Ito |
| 2008/0144380 A1* | 6/2008 | Youn et al. ............... 365/185.09 |
| 2008/0205140 A1* | 8/2008 | Lee et al. ................. 365/185.03 |
| 2009/0097316 A1* | 4/2009 | Lee .......................... 365/185.13 |
| 2009/0310414 A1* | 12/2009 | Lee et al. ................. 365/185.17 |
| 2011/0242892 A1* | 10/2011 | Namiki et al. ........... 365/185.17 |
| 2013/0128667 A1* | 5/2013 | Lee et al. ................. 365/185.11 |
| 2013/0272067 A1* | 10/2013 | Lee et al. ................. 365/185.11 |

\* cited by examiner

SHIELDING 2-CYCLE HALF-PAGE READ AND PROGRAM SCHEMES FOR ADVANCED NAND FLASH DESIGN

CROSS-REFERENCES TO RELATED APPLICATIONS

This application claims priority to U.S. Provisional Patent Application No. 61/687,227, filed on Apr. 20, 2012, commonly assigned, and hereby incorporated by reference in its entirety herein for all purposes.

This application is related to U.S. patent application Ser. No. 13/843,642, filed on Mar. 15, 2013, U.S. patent application Ser. No. 13/680,286, filed on Nov. 19, 2012, and PCT Application No. PCT/US2012/065734, filed on Nov. 18, 2012, commonly assigned, and hereby incorporated by reference in its entirety herein for all purposes.

BACKGROUND OF THE INVENTION

The present invention relates generally to nonvolatile memory technology. More particularly, the present invention relates to a new 2-cycle page-read operation for NAND flash memory by providing a BL shielding effect between odd and even BLs. Applications of the present invention can be expanded to existing NAND design and further to an improved HiNAND string and array by dividing traditional 1-cycle one-page read operation into 2-cycle half-page read operation, though more applications may be recognized on all Nonvolatile memory (NVM) cells that are using the traditional on-chip compact LV page buffer, SA design, and HV charge-pump circuits.

Nonvolatile memory is well known in the art. The different types of nonvolatile memory that employ a charge retention mechanism include Read-Only-Memory (ROM), Electrically Programmable Read Only Memory (EPROM), Electrically Erasable Programmable Read Only Memory (EEPROM), NOR Flash Memory, and NAND Flash Memory. The charge retention mechanism may be charge storage, as in a floating gate memory cell, a so-called Flash-based cell.

The NAND Flash memory cell design has several advantages. Firstly, it achieves the highest cell's scalability down to 1xnm, keeping with almost a constant cell pitch size that is a factor of approximately four times (4x) larger than the minimum feature size ($\lambda^2$) of the manufacturing technology. This has held in technologies with feature sizes from 0.25 μm down to 20 nm or below. This is the smallest nonvolatile memory cell when compared to other nonvolatile cell types. Secondly, NAND Flash memory cell design uses a low-current Fowler-Nordheim (FN) tunneling phenomena for both program and erase operations. The FN tunneling allows the program and erase operations to be performed in relatively larger memory unit sizes and a faster speed. The FN erase operation is typically performed in a unit of a large sector with sizes ranging from 512 Kb to 2 Mb and 1 ms fast erase time in current specifications. The FN program is performed in a unit of a large page size varying from 512 B to 2 KB with a fast speed of 200 μs typically in the current specifications. Like EEPROM and NOR flash, NAND Flash memory provides the repeatedly in-system or in-circuit electrically programmable and erasable functions with the lowest die cost.

When NAND density increases to above 64 Gb a die, the page size increases from 512 B to above 8 KB. In such a big page size, the WL is increased to a longer length in the X-direction. In today's NAND flash memory, the whole array with long word lines WLs is divided into a plurality of sub-arrays. The long WL in X-direction is not divided into a plurality of sub-WLs due to the layout pitch difficulty to make the strapping WL. Therefore, the division of a long WL page of large NAND flash array is done without the division of the long WL; Instead, the division of whole large NAND array is done by the partition of TPW and DNW in the X-direction but with a long and common WL crossing over the division of TPW (triple P-well) and DNW (deep N-well). Each divided NAND flash array is referred to as a plane. The number of planes can be 2, 4, 8, 16, or more, subjecting to the NAND page size defined by NAND flash system.

In addition, the NAND block size here is defined as one NAND sub-array with the array Y-length of one NAND string, but X-width is the pitch of N bit lines BLs within one selected vertical NAND plane.

The major NAND cell, NAND string, cell block, NAND plane and NAND array structures and operations from different NAND companies are very similar. The mainstream NAND cells are either made of 2-poly floating-gate NMOS or 1-poly charge-trapping NMOS storage devices. In a charge trapping mechanism, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$). The major NAND strings are formed of either 32-cell string or 64-string for multi-level cell (MLC) read. For the physical 32-cell NAND string in layout, the SLC NAND storage will make it into 32-page logic string, while the MLC NAND storages will make it into 64-page logic string. Similarly, for the physical 64-cell NAND string in layout, the SLC NAND storage will make it into 64-page logic string, while the MLC NAND storages will make it into 128-page logic string.

Currently, the mainstream standalone NAND in mass production is mainly based only 2-poly floating-gate NMOS device. The NAND flash employs the extremely HV but low current FN channel-erase and FN channel-program scheme to change the stored data in unit of block. The NAND block size is increasing from old 512 Kb to 8 Mb today due to the page size increase from 512 B to 8 KB.

Although NAND has many advantages such as the lowest die cost, the smallest die size and the fastest program and erase speed due to the low-current channel FN tunneling scheme used, it suffers more and more program and read disturbances when its technology node migrates toward 1xnm. The P/E endurance cycles keeps dropping from 100K cycles made of node above 30 nm to be less than 1K cycles made of nodes below 2xnm. There are many reasons to for the degradation of P/E cycles when scaling down to 1xnm. These factors include the WL and BL disturbances during page-base MLC Program and Program-Inhibit operations and the WL and BL disturbances during the page-base MLC Read operation within the selected block within the selected plane. This invention fully focuses on the study of the various drawbacks of the current NAND's page-based read operation from the top view of NAND plane and NAND array. More particularly, the focus of this invention is to identify the drawbacks of NAND's sub-page-based Read operation and then to provide a novel read solution that can effectively and safely eliminate the notorious BL-coupling effect and WL-induced threshold voltage level $V_t$ disturbance within the selected and non-selected planes of the NAND array.

Therefore, current NAND's page-based read operation has various drawbacks, improved NAND read solution that can effectively and safely eliminate notorious BL-coupling effect and WL-induced threshold voltage disturbance within the selected and non-selected planes of the NAND array are needed and become objectives of the present invention.

BRIEF SUMMARY OF THE INVENTION

The present invention relates generally to nonvolatile memory technology. More particularly, the present invention relates to a new 2-cycle page-read operation for NAND flash memory by providing a BL shielding effect between odd and even BLs. Applications of the present invention can be expanded to existing NAND design and further to an improved HiNAND string and array by dividing traditional 1-cycle one-page read operation into 2-cycle half-page read operation.

An object of this invention is to provide a circuit of NAND cell string within the NAND block of NAND array to allow the highly effective BL shielding 2-cycle half-page read operation to eliminate the noise coupling between any adjacent BLs with very tight layout spacing and without any process change.

Further, another object of this invention is to disclose how to divide the whole NAND array into two equal interleaving half planes. One of half-plane comprises all odd BL strings and the other half-plane comprises all even BL strings divided source line SL. Each of the odd BLs in the half-plane has its own 1-poly odd SL select-transistor and odd divided SL. Similarly, each of the even BLs in another half-plane has its own 1-poly even SL select-transistor and even divided SL. And each odd or even divided SL has its own SL-decoder. All 2-poly flash transistors and 1-poly BL and SL select transistors are placed in the common TPW (Triple-P-well) within the common DNW (deep N-well) on top of common P-substrate like the conventional NAND cell array.

Still further, an object of this invention is to provide divided odd and even global source line decoder schemes in each block. In an embodiment, the global source lines are laid out to be running horizontally in parallel to all horizontal WLs but perpendicular to all vertical BLs. While in another embodiment, the global source lines are laid out to be running vertically in parallel to all vertical BLs but perpendicular to all horizontal WLs.

Yet still further, another object of this invention is to provide a novel new NAND array with a shielding method and apparatus applied alternating in odd and even NAND strings so that the initial pre-charged program-inhibit voltage can be retained without being mistakenly discharged. The undesired discharge is due to the coupling effect between NAND strings when some of the page buffer's stored data is "0" that would pull down the HV program-inhibit voltage in the selected BLs of NAND array. The two embodiments respectively correspond to two decoder schemes for odd and even GSLs.

Even further, another object of this invention is to provide a new NAND page read flow that comprises two half-page read cycles. While reading the first odd or even half-page from the selected NAND page, the other even or odd half-page acts as the shielding half-page to prevent the noise coupling between even and odd BLs. As a result, the accurate data reading of the first selected half-page can be guaranteed. Subsequently, the second half-page read is repeated with the same step as first half-page read and whole selected page is completed with accurate data in two half-page read cycles.

Furthermore, an object of the invention is to teach how each half-page NAND read operation is divided into three preferable key steps: a first step of the half-page read is defined as Gate voltage setup period for the selected WL in either SLC or MLC read operation; a second step of the half-page read is defined as pre-charge period for all selected BLs, irrespective of odd or even BLs, in the NAND array; a third step of the half-page read is defined as half-page Data sensing period. In this period, BLs in non-selected half page are kept pre-charged BL voltage as shielding BLs, the selected half page BLs are then either discharged to ground or kept in pre-charged BL voltage, subjected to the data patterns stored and controlled by page buffer.

An alternative object of the invention is to expand the above plane-based half-page shielding two-cycle read to whole NAND array that comprises a plurality of N planes in the X-direction when the page size gets N-fold larger in X-direction but only one or more short pages within in one or more selected planes are selected for read at a time. Since the WLs are shared by all planes, the pages within the unselected planes have to be kept at pre-charged BL voltage to avoid the read WL disturbance for higher P/E endurance cycles.

Moreover, another object of this invention is to extend the BL-shielding scheme used in read operation to program operation. As a result, the conventional unreliable LSBPI (Local-Self-Boosting Program Inhibit) or GSBPI (Global-Self-Boosting Program Inhibit) techniques can be replaced by the half-page Shielding Program Inhibit of this invention for future NAND page program operation in more advanced nodes.

To accomplish at least one of these objects, an embodiment includes a well array-division method and structures of NAND cell string, NAND block, NAND plane of NAND array along with the operations to enable using the similar small LV page-buffer along with the odd and even BL and SL decoders by strong, deep erasing erase and erase verifying, half-page programming, and half-page program verifying and Inhibit and half-page reading NAND memory cells in the NAND strings.

A block of a NAND array comprising of the NAND memory cell strings are arranged in plurality of rows and columns. Each of NAND flash memory cell string is formed of n NAND flash cells sandwiched with two select transistors placed on both top and bottom ends in series. The LV page buffers with same width of BL numbers is placed on top of the array with its plurality of outputs connected to all BLs which are divided into two equal groups such as the odd and even groups. A plane of a NAND array comprising of the NAND memory odd and even cell strings are arranged in plurality of rows and columns. Each of NAND flash memory cell string is formed of n NAND flash cells sandwiched by two select transistors placed respectively on top and bottom ends in the series. The LV page buffer with the same width of BL numbers is placed on top of the array with its plurality of outputs connected to all BLs, those of which are divided into two equal groups such as the odd and even groups.

In a specific embodiment, the present invention provides a NAND memory block circuit for two-cycle half-page read operation. The NAND memory block circuit includes a NAND cell array comprising a plurality of memory cells built in a common P-well region and arranged as multiple pages in rows in x-direction and multiple strings in columns in y-direction. Each page of memory cells is associated with a word line in the x-direction and each string of memory cells is associated with a bit line in the y-direction. The x-direction is perpendicular to the y-direction. The memory block circuit further includes a first string decoder located at one end of the multiple strings. The first string decoder includes a row of 1-poly NMOS select-gate transistors having a first common gate input and respectively connecting drain nodes to the bit lines of corresponding strings. Additionally, the memory block circuit includes a second string decoder located at another end of the multiple strings. The second string decoder includes a first half-row of odd-column 1-poly NMOS select-gate transistors plus a first extra 1-poly NMOS select-gate transistor and a second half-row of even-column 1-poly NMOS select-gate transistors plus a second extra 1-poly NMOS select-gate transistor. The first/second half-row of odd/even-column 1-poly NMOS select-gate transistors are respectively gated by a second/third common gate input for associating all odd/even-column strings with an odd/even group local source line in the x-direction. The first/second extra 1-poly NMOS select-gate transistor is also gated by the second/third common gate input to control a coupling between an odd/even common source line in the y-direction and the odd/even group local source line in the x-direction. According to an embodiment, the first string decoder allows bit lines of all odd-column and even-column strings being pre-charged to a bit line voltage Vbl in a pre-charge period of a half-page read operation. The second string decoder allows the odd-column strings in a selected page of the multiple pages being discharged in a data sensing period of the half-page read operation while the even-column strings in the selected page are retained at the pre-charged bit line voltage Vbl so as not be pulled down by the discharge of the odd-column strings to prevent the read of the odd-column strings from being affected by any coupling noise.

In another specific embodiment, the present invention provides a NAND memory plane circuit configured for a two-cycle half-page read scheme. The NAND memory plane circuit includes M NAND blocks arranged in series in y-direction sharing N global bit lines of BL1 through BLN respectively for N strings, an odd-string common source line CSL[o], and an even-string common source line CSL[e]. M and N are an even number greater than 2. Each NAND block includes a NAND cell array comprising a plurality of memory cells arranged as K rows of pages in x-direction capped by two rows of dummy cells and the N columns of strings in the y-direction. Each page of memory cells is associated with a word line in the x-direction and each string of memory cells is associated with a local bit line in the y-direction. Each memory cell includes one 2-poly High-voltage floating gate transistor with its channel aligned in the y-direction. The x-direction is perpendicular to the y-direction. The NAND block further includes a first string decoder located at one end of the N strings. The first string decoder includes a row of 1-poly NMOS select-gate transistors having a first common gate input and respectively coupling the global bit lines to the local bit lines of corresponding strings. Additionally, the NAND block includes a second string decoder located at another end of the N strings. The second string decoder includes a first half-row of odd-column 1-poly NMOS select-gate transistors plus a first extra 1-poly NMOS select-gate transistor and a second half-row of even-column 1-poly NMOS select-gate transistors plus a second extra 1-poly NMOS select-gate transistor. The first/second half-row of odd/even-column 1-poly NMOS select-gate transistors are respectively gated by a second/third common gate input for associating all N/2 odd/even-column strings with an odd/even group local source line LSL[o]/LSL[e] in the x-direction. The first/second extra 1-poly NMOS select-gate transistor is also gated by the second/third common gate input to control a coupling between the odd/even-string common source line CSL[o]/CSL[e] in the y-direction and the odd/even group local source line LSL[o]/LSL[e] in the x-direction. Furthermore, the NAND memory plane circuit includes an X-decoder circuit configured to connect a plurality of row-data lines in the x-direction to the M NAND blocks. For each NAND block the plurality of row-data lines includes a top decoder line connected to the first common gate input, a pair of bottom decoder lines respectively connected to the second common gate input and the third common gate input, and K word lines respectively connected to the K pages and a pair of dummy word lines connected to the corresponding two dummy cells. Moreover, the NAND memory plane circuit includes a low-voltage SA&PGM buffer circuit made from PMOS and NMOS devices with a power supply voltage Vdd and connected in the y-direction with the pair of common source lines CSL[o] and CSL[e] and all the global bit lines BL1 through BLN of the M NAND blocks. According to an embodiment, the first string decoder allows local bit lines of all odd-column and even-column strings of all M NAND blocks being pre-charged to a bit line voltage Vbl in a pre-charge period of a half-page read operation. The second string decoder allows the local bit lines of the odd-column strings in a selected page of a selected block of the M NAND blocks being discharged in a data sensing period of the half-page read operation while the local bit lines of the even-column strings in the selected page of the selected block of the M blocks are retained at the pre-charged bit line voltage Vbl so as not be pulled down by the discharge of the odd-column strings to prevent the read of the odd-column strings from being affected by any coupling noise.

In an alternative embodiment, the present invention provides a HiNAND memory sector circuit configured for a two-cycle half-page read scheme. The HiNAND memory sector circuit includes M HiNAND blocks arranged in series in y-direction sharing a common P-well region and N global bit lines of BL[1] through BL[N] respectively for N strings in the y-direction. M is selected from 8, 16, 32, and more. N is an integer number of memory bit size. The HiNAND block includes a plurality of memory cells built in the common P-well region and arranged as K pages in rows in x-direction plus one extra row of 2-poly NMOS select-gate flash cells and N strings in the columns in the y-direction. Each page is associated with a word line. Each string is associated with a local source line and a local bit line. Each memory cell includes one 2-poly NMOS floating gate transistor with its channel aligned in the y-direction. The x-direction is perpendicular to the y-direction. K is an integer selected from 32, 64, 128, and more. The HiNAND memory sector circuit further includes a pair of global source lines CSL[o] and CSL[e] laid in the y-direction. Additionally, the HiNAND memory sector circuit includes a first string decoder located at one end of the M HiNAND blocks. The first string decoder includes a row of N 1-poly NMOS select-gate transistors having a first common gate input and respectively connecting corresponding drain nodes to the N global bit lines BL[1] through BL[N] and corresponding source nodes to the N local bit lines through all the M HiNAND blocks. Furthermore, the HiNAND memory sector circuit includes a second string decoder located at another end of the M HiNAND blocks. The second string decoder includes N/2 odd-column 1-poly NMOS select-gate transistors plus a first extra 1-poly NMOS select-gate transistor and N/2 even-column 1-poly NMOS select-gate transistors plus a second extra 1-poly NMOS select-gate transistor. The N/2 odd/even-column 1-poly NMOS select-gate transistors are respectively gated by a second/third common gate input for associating all N/2 odd/even-column strings with an odd/even group local source line LSL[o]/LSL[e] in the x-direction. The first/second extra 1-poly NMOS select-gate transistor is also gated by the second/third common gate input to control a coupling between the global source line CSL[o]/CSL[e] in the y-direction and the odd/even group local source line LSL[o]/LSL[e] in the x-direction. According to an embodiment, the first string decoder allows the N local bit lines of all odd-column and even-column strings of all the M HiNAND blocks being pre-charged to a bit line voltage Vbl in a pre-charge period of a half-page read operation. The second string decoder allows the odd-column strings in a selected page of the K pages of a selected block of the M HiNAND blocks being discharged in a data sensing period of the half-page read operation while the even-column strings in the selected page are retained at the pre-charged bit line voltage Vbl so as not be pulled down by the discharge of the odd-column strings to prevent the read of the odd-column strings from being affected by any coupling noise.

In particular, this novel shielding 2-cycle read scheme disclosed in the present specification is applicable in today's MLC NAND or MLC HiNAND flash design with the same Low-voltage Program Page Buffer (PPB) and same Sense Amplifier (SA) designs. As opposed to whole page-read operation performed in 1-cycle Read as commonly used in today's NAND, the present invention proposes a novel shielding 2-cycle Page-read operation to read two half-pages out of single selected page within a NAND plane. The first cycle is to read either half-page comprising all odd BLs or even BLs, and then the second cycle is to read the remaining half-page comprising even or odd BLs of the selected page within the same NAND plane.

More specifically, an embodiment of this invention provides the novel BL shielding effect between any adjacent odd and even BL pairs in the selected page during NAND page read operation. As a result, any adjacent BL noise-coupling's induced errors can be prevented when NAND page reading is performed in units of half-page with two read cycles, rather than in unites of a whole page. In addition, the WL-induced threshold voltage level $V_t$ disturbance in the selected page is also reduced during NAND's page read operation. Although there is a drawback of two cycles of half-page read to replace 1-cycle of full-page read such that the read speed is halved, but the advantage of half-page shielding read is justified due to the read data guaranteed to be immunized from the coupling-error when NAND technology migrates towards 1×nm, which has a severe read coupling effect between two very tight BL-spacing.

The novel half-page shielding read scheme in the NAND plane and NAND array of the present invention can be applied to today's NAND flash technology, irrespective of 3D or 2D NAND string and array, PMOS or NMOS NAND string and array, 2-poly floating-gate type or 1-poly charge-trapping type NAND string and array.

Many benefits can be achieved by applying the embodiments of the present invention. These and other benefits may be described throughout the present specification and more particularly below.

DETAILED DESCRIPTION OF THE INVENTION

The present invention relates generally to nonvolatile memory technology. More particularly, the present invention relates to a new 2-cycle page-read operation for NAND flash memory by providing a BL shielding effect between odd and even BLs. Applications of the present invention can be expanded to existing NAND design and further to an improved HiNAND string and array by dividing traditional 1-cycle one-page read operation into 2-cycle half-page read operation, though more applications may be recognized on all Nonvolatile memory (NVM) cells that are using the traditional on-chip compact LV page buffer, SA design, and HV charge-pump circuits.

Figure 1:
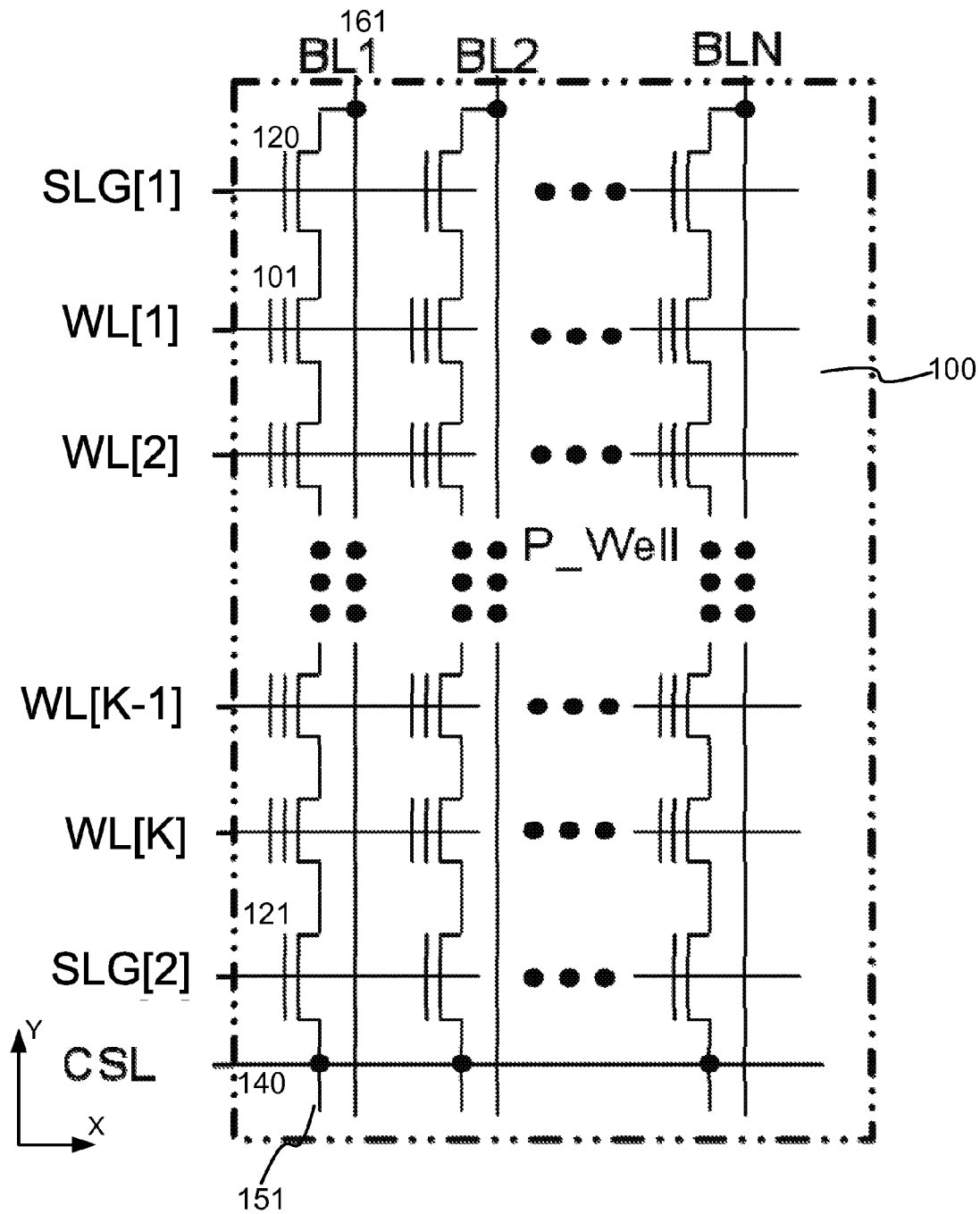
FIG. 1 is a schematic diagram of prior art of a block of the conventional NAND memory array that comprises N vertical NAND strings.

FIG. 1 is a schematic diagram of prior art of a block of the conventional NAND memory array that comprises N vertical NAND strings. Presenting this conventional NAND memory block diagram is merely used as part of an inventive process as described below. As seen, each NAND string 151 comprises K flash cells made of 2-poly floating-gate NMOS NAND transistors 101 connected in series respectively with their gates connected to WL[1] through WL[K] and two 1-poly NMOS select-gate transistors 120, 121 located on both ends of the string with their gates connected to SLG[1] and SLG[2] respectively. The whole NAND transistors 101 in the same NAND string 151 and a whole block 100 are formed on the same TPW (Triple P-Well) within the same DNW (deep N-well) on the common Psub (P-substrate) with one common source line CSL 140 and common string select SG lines. The NAND block 100 has multiple separate N BLs and K WLs and two separate SG lines. The BLs 161 in the whole array of FIG. 1 are not configured into two half-arrays (i.e., a half odd array and a half even array). The CSL is the common source line. There is no local source line needed in this whole conventional NAND array circuit.

Prior to performing read operation (on a selected page associated with a selected WL), all BLs (BL1 to BLN) are pre-charged to a desired BL voltage with the SLG[2] voltage biased to Vss but SLG[1] biased to Vdd or higher voltage and all K−1 WLs coupled to Vdd but the selected WL biased at a read-voltage of Vread. As a result, all BL capacitors are pre-charged to the desired BL voltage, which can be Vdd or around 1.0V. Usually, the pre-charged BL voltage has to be set to be higher than a sense amplifier trip point in next stage.

After the pre-charge period, all the unselected K−1 WLs are ramped to a pass-voltage level Vpass of around 6.0V along with SLG[2] gate voltage increased to Vdd with the CSL voltage coupled to Vss. If a MLC threshold voltage $V_t$ of the selected flash cell in the selected page is lower than the set read-voltage of Vread, the NAND string will conduct the current to discharge the BL to Vss. If the MLC $V_t$ of the selected flash cell in the selected page is still higher than the set read-voltage of Vread, the NAND string will not conduct the current so that pre-charged BL voltage will sustain the same voltage without being discharged to Vss. For MLC page read, the Vread will have three desired voltage levels such as Vread1 of 0V, Vread2 of 1.5V, Vread3 of 3V to read four MLC $V_t$s such as $V_{t1}$ of −2V, $V_{t2}$ of 1V, $V_{t3}$ of 2.25V and $V_{t4}$ of 3.75V.

This conventional NAND array works well for many generations. But when NAND technology migrates below 30 nm, the spacing between BLs becomes very narrow. In the worst-case scenario, one NAND BL and associated string with non-conduction $V_t$ state could possibly be sandwiched by two adjacent conduction BLs and strings. As a result, the non-conduction BLs and NAND strings supposed to retain the BL pre-charged voltage would potentially be coupled to low by two adjacent discharging BLs. In this case, the read data from the non-conduction BLs would be mistakenly changed from "1" to "0".

Figure 2:
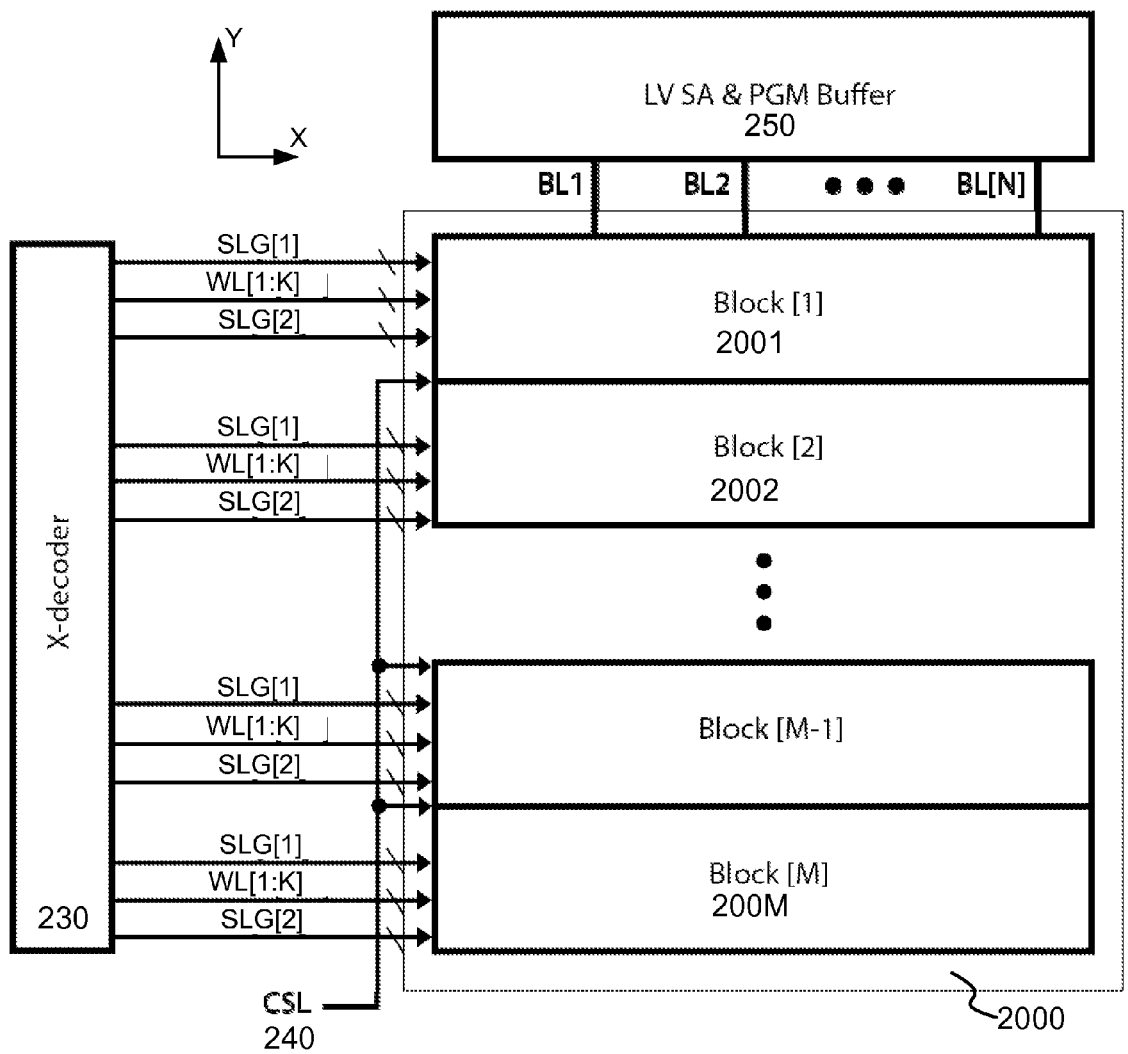
FIG. 2 is a schematic NAND plane diagram of prior art of a typical NAND flash memory sub-array comprising M NAND memory vertical blocks in Y-direction within the same NAND plane.

FIG. 2 is a schematic NAND Plane diagram of prior art of a typical NAND flash memory sub-array comprising M NAND memory vertical blocks in Y-direction within the same NAND plane. Presenting this conventional NAND memory block diagram again is merely used as part of an inventive process as described below. As seen, an X-decoder 230 is placed in left of a NAND memory plane 2000 (including M memory blocks 2001 through 200M) and LV SA (Sense Amplifier) and LV PGM buffer (Program page buffer) 250 are situated on top of the plane 2000. In this NAND plane configuration, the WL-length is not very long. In a specific embodiment, for higher NAND flash densities, there are more planes to be placed side by side in X-direction. Then, the LV SA & PGM Page buffer 250 has to be expanded in the X-direction.

Note, the definition here for NAND planes means a NAND array comprises a plurality of M NAND strings in Y-direction and plurality of N BLs in X-direction. Within the same NAND plane, global WLs, local BLs, local SLs and global string select signals, TPW and DNW are shared. But in the different NAND planes, global WLs and string select signals are still shared while the TPW and DNW are separated.

Each memory block (e.g., block 2001) within the NAND plane 2000 is substantially the same as NAND block 100 with its detailed circuit shown in FIG. 1. All M NAND memory blocks are formed on the same big TPW within the same big DNW on the common P-substrate with one common source line CSL 240 and the multiple M sets of separate K WLs connected to the outputs of the X-decoder 230 and M sets of dual SG lines along with N BLs. All CSL lines in each NAND-block pair are simply grouped together into one CSL line 240. In this conventional NAND array, the read errors and Read disturbances would be increased when the page size is increased when migrating towards 2×nm node.

Figure 3:
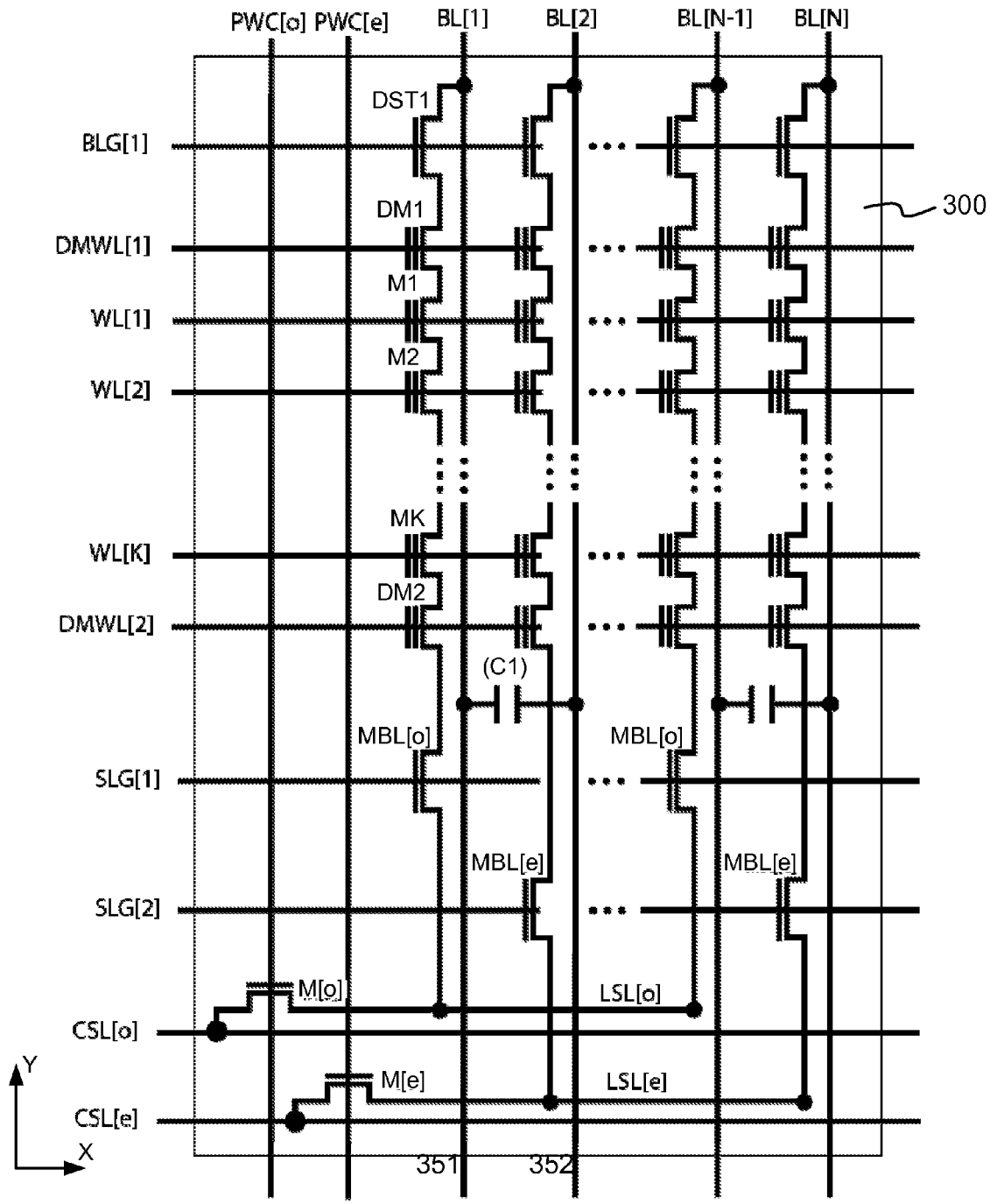
FIG. 3 is a NAND block schematic diagram according to an embodiment of the present invention.

In order to solve the issue of any non-conduction BLs and NAND strings being dragged their BL pre-charged voltages to low by two adjacent discharging BLs. A new NAND block circuit diagram is proposed. FIG. 3 is a NAND Block schematic diagram according to an embodiment of the present invention. This diagram is merely an example, which should not unduly limit the scope of the claims herein. One of ordinary skill in the art would recognize other variations, modifications, and alternatives. This preferable embodiment of an improved NAND string/block is modified from prior-art NAND string/block circuits as shown in FIG. 1. Like conventional NAND string/block diagram, each NAND string 351 in the NAND block 300 comprises K 2-poly floating-gate NMOS NAND transistors, such as M1 to MK, connected in series with top and bottom 2-poly dummy transistors, such as DM1 and DM2, and two 1-poly NMOS SG (Select-gate) transistors such as DST1 on the top and MBL[o] at the bottom of odd string 351 and MBL[e] of even string 352. But two major changes are introduced in this circuit compared to convention NAND plane. A first change is to divide all BLs in each NAND plane into two groups such as the odd-BL group and the even-BL group. A second change is to separate odd LSLs (local SLs) and even LSLs and respective gates' control logics.

All BLs, BL[1] to BL[N], are divided into two groups such as odd-BL group comprising BL[1], BL[3], . . . , BL[N/2+1] and even-BL group comprising BL[2], BL[4], . . . , BL[N/2]. The odd/even division is done through the source line. The odd-BL group has its own common horizontal LSL[o], while the even-BL group has another common horizontal LSL[e]. The LSL[o] is connected to the global horizontal CSL[o] through a NMOS transistor of M[o] gated by PWC[o], while the LSL[e] is connected to the other global horizontal CSL[e] through a NMOS transistor of M[e] gated by PWC[e]. Additionally, there is a big effective coupling capacitance C1 between adjacent odd-BL group and even-BL group (note that no actual capacitor device is added there). For a large NAND density, each BL capacitance can as big as few pfs. The coupling capacitance C1 between odd and even BLs can be the same order when migrating below 3×nm technology node.

Figure 4:
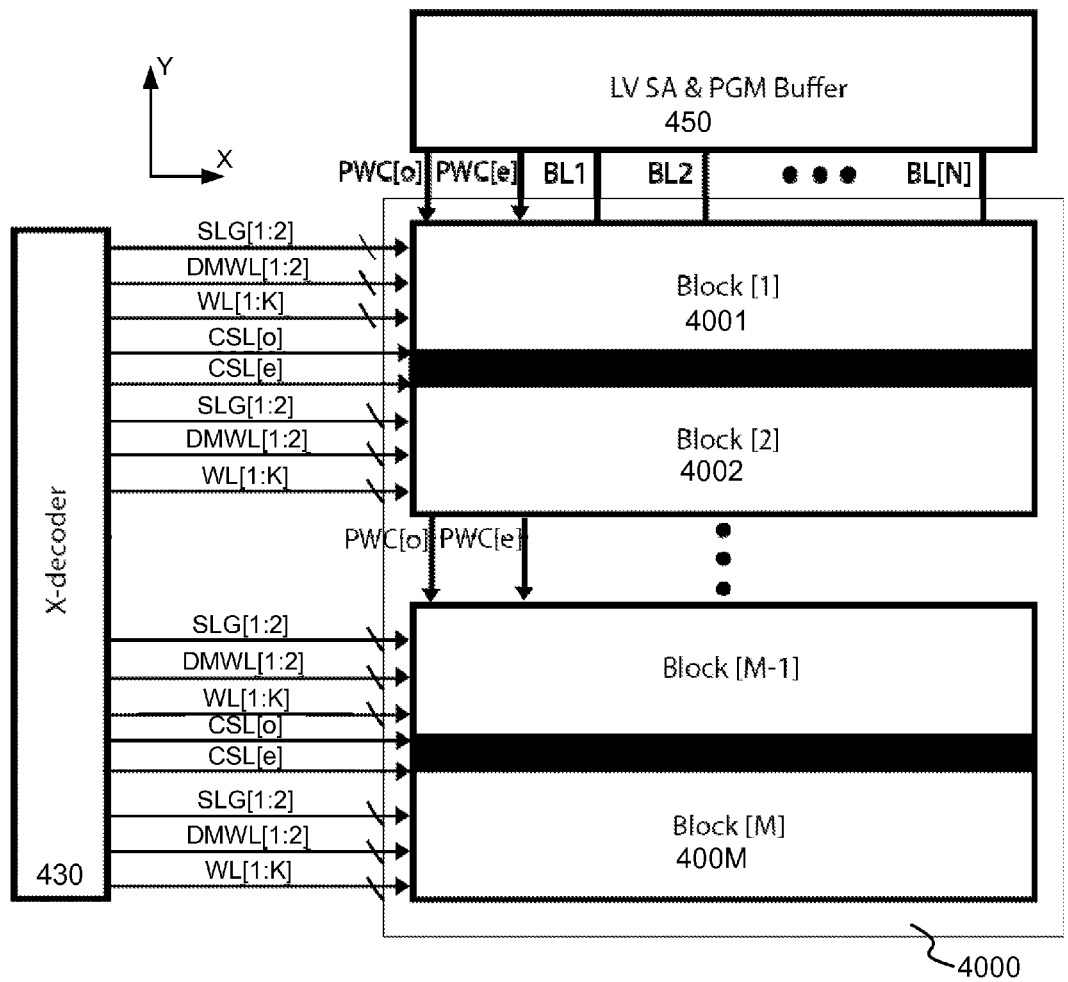
FIG. 4 is schematic NAND plane diagram according to an embodiment of the present invention.

FIG. 4 is schematic NAND Plane diagram according to an embodiment of the present invention. This diagram is merely an example, which should not unduly limit the scope of the claims herein. One of ordinary skill in the art would recognize other variations, modifications, and alternatives. As shown, a NAND plane 4000 comprises M NAND vertical blocks 4001 through 400M placed side-by-side in Y-direction sharing N BLs but with two extra vertical lines of odd and even PWC signals to control two horizontal CSLs respectively coupled to two LSLs for divided odd and even strings. An X-decoder 430 is placed in the left of the NAND plane 4000 and LV SA & PGM Page buffer 450 is situated on top of the array 4000. In this NAND plane configuration, the WL-length is not very long. For higher NAND flash density, there are more planes to be placed side by side in the X-direction so that the LV SA & PGM Page buffer 450 has to be expanded in X-direction.

The detailed circuit of each NAND block (e.g., 4001) within the NAND plane 4000 is substantially the same as the NAND block 300 shown in FIG. 3. All M NAND memory blocks 4001 through 400M are formed on the same big TPW (Triple P-Well) within the same big DNW (deep N-well) on the common P-substrate with one common source line CSL and the multiple M sets of separate K WLs connected to the outputs of the X-decoder 430 and M sets of dual SG lines along with N BLs connected to the LV SA & PGM Page buffer 450. One major difference between FIG. 2 and FIG. 4 is the routing of the local source line LSL. In FIG. 4 of the present invention, one CSL (in FIG. 2) is preferably divided into two lines of CSL[o] and CSL[e] in each block. Total M/2 pairs of CSL[o] and CSL[e] lines are preferably not grouped together like FIG. 2 to allow a reliable half-page BL-shielding read operation according to an embodiment of the present invention.

The read operation of NAND Plane 4000 of FIG. 4 is explained below. In a normal MLC or SLC read operation, only one block is selected from M vertical blocks and only one WL is selected from K WLs in a selected NAND string. The most popular numbers of K are either 32 or 64 per block. Therefore, only one group of the control signals such as SLG[1], SLG[2], WL[1] to WL[K], CSL[o], CSL[e], DMWL [1:2] and PWC[o] and PWC[e] of the selected page of the selected block in the selected plane 4000 have to be biased at right MLC read-voltage Vread in accordance with the reading of normal NAND block. The SLG[1], SLG[2], WL[1] to WL[K], CSL[o], CSL[e], DMWL[1:2] signals in the remaining unselected blocks would be biased to Vss (or grounded) to turn off the non-selected M−1 NAND blocks from global BLs to prevent the BL read leakage for accurate reading.

The BL pre-charge comes from top LV SA & PGM-buffer 450. But the BL discharge route is set through the NAND strings to SLG[1:2] to both LSL[o] and LSL[e] once the Vread on the selected WL is set to be higher than the stored MLC threshold voltage $V_t$ value. For four-level MLC page reads, only three Vread voltage levels are required as explained above and in many of the prior arts. Each MLC page read can be done in 1-cycle whole-page-based sensing approach. The details will not be repeated in this description. Instead, a two-cycle half-page read operation with shielding will be disclosed below in more details.

Figure 5:
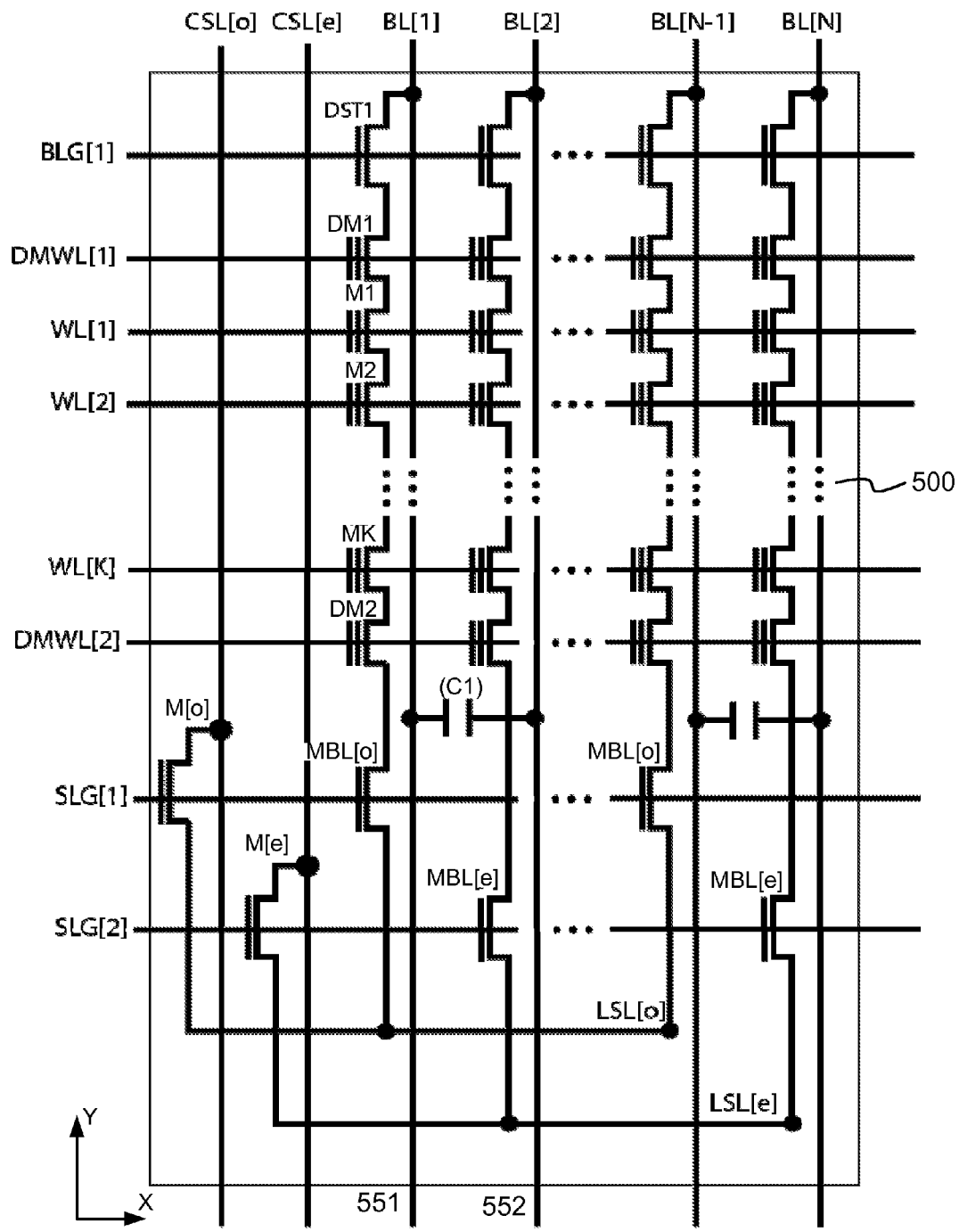
FIG. 5 is a NAND block schematic diagram according to another embodiment of the present invention.

FIG. 5 is a NAND block schematic diagram according to another embodiment of the present invention. This diagram is merely an example, which should not unduly limit the scope of the claims herein. One of ordinary skill in the art would recognize other variations, modifications, and alternatives. As seen in FIG. 5, an alternative NAND block diagram is modified from that shown in FIG. 3. Further, each NAND string 551 (or 552) of the NAND plane 500 comprises K 2-poly floating-gate NMOS NAND transistors (M1 through MK) connected in series with top and bottom 2-poly DMWLs (DM1 and DM2) and two 1-poly NMOS SG transistors placed on the top and bottom ends of the string but with one major change in the circuit. The top SG transistors DST1 have their drain nodes respectively connected to BLs (BL[1] through BL[N]). All gates of top DST1 transistors couple to common BLG[1] line in X-direction. This is the same as the configuration in FIG. 3.

Unlike FIG. 3, the change is the one pair lines of CSL[o] and CSL[e] running vertically (in Y-direction) in FIG. 5. In each block, there is one pair of 1-poly NMOS HV transistors, M[o] and M[e], with their drains connected to separate CSL [o] and CSL[e] respectively along with their gates respective coupled to two control signal lines of SLG[1] and SLG[2] in X-direction.

Now with this circuitry configuration described above, the full single-page read operation is divided into two-cycle three-step half-page read operations. Each cycle is a half-page (first for odd half-page then for even half-page or vice versa) read operation. The first cycle half-page read operation includes 1) a first step, i.e., a biased condition setup period in which appropriate voltages are set up respectively for one selected MLC WL, K−1 unselected WLs, BLG[1], SLG[1], SLG[2], CSL[o] and CSL[e]; 2) a second step, i.e., a BL pre-charge period in which all selected BLs, such as BL[1] through BL[N], are pre-charged to a Vbl level (Vbl<Vdd, Vbl is not a fixed value which is clamped by a specific sensing scheme. In most conventional NAND flash cell, the highest Vbl is about Vdd−Vt); 3) a third step, i.e., a half-page data sensing period in which all selected BLs, BL[1] through BL[N], are coupled to Vbl or other desired voltage levels and so do all the selected NAND strings. Then the second cycle half-page read operation repeats above three steps on the remaining half-page. More details about the two-cycle three-step half-page read operation based on the new NAND block circuitry will be found below.

In a specific embodiment, during the bias condition setup period of the first cycle half-page read operation, all BLs and the two common source lines in vertical direction are grounded to Vss (0V). The BLG[1] line is applied to Vdd so that all the gates of top DST1 SG transistors are in On state. At the same time, all WLs (including one selected WL and K−1 unselected WLs are biased at Vss (or 0V). Two dummy WLs are also coupled to Vss. The SLG[1] decoder line is grounded to Vss to shut off all odd NAND strings and the SLG[2] decode line is biased to Vdd at this period along with both the odd common source line CSL[o] and CSL[e] being bias at Vss or 0V.

Then the half-page read operation enters the pre-charge period, the selected control gate signal BLG[1] is coupled to Vdd or higher to turn on all DST1 transistors for pre-charging each local bit lines from the top common BLs. all BLs are pre-charged to a voltage level of Vbl from the top of the strings along with the SLG[1] being still biased at the Vss level to shut off odd-strings along with Vss level being applied to odd CSL[o] (which can also be in floating state), While the SLG[2] is biased to the Vdd level along with the even CSL[e] being raised to Vdd level so that the even string local source lines LSL[e] are also charged to retain the pre-charged BL voltage Vbl in all even bit lines. In this period, the selected WL is biased at Vss level along with K−1 non-selected WLs now biased at the Vdd level. Two dummy WLs are also coupled to Vdd level. After this period, all BL capacitance are pre-charged to the Vbl level, regardless of data pattern stored in the top PGM page buffer.

Now, the first cycle half-page read operation moves to the data-sensing period of read operation. Assuming the odd half-page is read first in the first cycle, then the even half-page BLs have to remain at pre-charged BL voltage Vbl level to act as the N/2 BL shielding strings while reading data from N/2 odd strings. To achieve this goal, the gate signal SLG[2] and the drain node signal CSL[e] of transistor M[e] are kept at Vdd to keep LSL[e] retaining the Vdd level, but the drain node signal CSL[o] stays at the Vss level while the gate signal SLG[1] of transistor M[o] is raised to Vdd level to pull down LSL[o] to the Vss level. For the start of the first cycle half-page data sensing, the selected WL is ramped up to a read-voltage of Vread level while the voltage levels of un-selected K−1 WLs and two dummy WLs are now ramped to a WL-pass voltage of Vpass set to be around 6.0V to turn on the possible programmed cells in the whole NAND string. The odd BLs' voltages would be either kept at the pre-charged BL voltage Vbl level or discharged to the Vss level, depending on the data pattern stored in the PGM page buffer. But because N/2 even BLs are kept at full pre-charged BL voltage for shielding the neighboring odd strings, the discharge of odd BLs would not cause the even strings to be pulled down from the pre-charged BL voltages (e.g., Vbl level). As a result, the half-page (odd-string) reading would be very reliable.

After successfully sensing the first (odd) half-page data, another (even) half-page read cycle is continued with same steps from 1) to 3) above. The biased conditions for the even half-page are reversed to odd half-page read described above. In an embodiment associated with the even half-page read operation, N/2 odd BLs are kept at full pre-charged BL voltage for shielding the neighboring even strings, the discharge of even BLs would not cause the odd strings to be pulled down from the pre-charged BL voltages (e.g., Vbl level). In this process, the LSL[e] is pulled down to Vss, while the LSL[o] is coupled to Vdd to sustain odd BLs in a pre-charged state without leakage. In order to do that, the SLG[1] and CSL[o] are coupled to Vdd but CSL[e] is biased to Vss with both SLG[1] and SLG[2] biased at Vdd.

Figure 6:
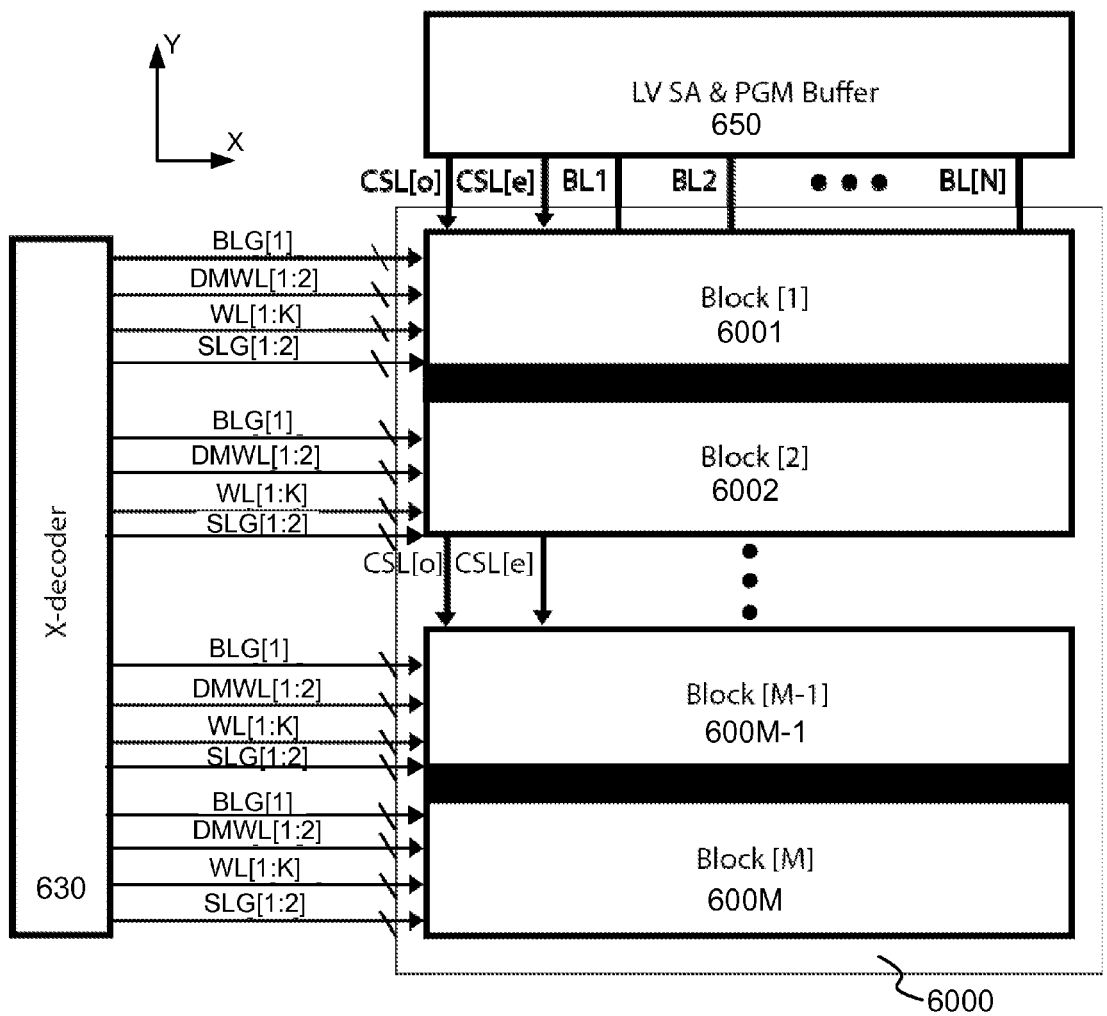
FIG. 6 is a schematic NAND plane diagram according to another embodiment of the present invention.

FIG. 6 is a schematic NAND plane diagram according to another embodiment of the present invention. This diagram is merely an example, which should not unduly limit the scope of the claims herein. One of ordinary skill in the art would recognize other variations, modifications, and alternatives. Similar to the embodiment shown in FIG. 4, each NAND plane 6000 comprises M NAND vertical blocks (6001 through 600M) placed side by side in the Y-direction with N bit lines BLs but two extra vertical lines of CSL[o] and CSL[e] running across the M vertical blocks. An X-decoder 630 is placed in the left of the NAND plane 6000 having outputs of a top select-gate line BLG[1], two bottom select-gate lines SLG[1:2], two dummy WLs DMWL[1:2], and K word lines WL[1:K] connected to each vertical block. LV SA and LV PGM buffer 650 are situated on top of the array configured to connect the two vertical common source lines CSL[o] and CSL[e] and all global BLs (BL[1] through BL[N]). In this NAND plane configuration, the WL-length is not very large. In a specific embodiment, higher NAND flash densities may be associated with more planes placed side by side in X-direction. Then, the LV SA & PGM Page buffer 650 has to be expanded in X-direction.

Note, the above explanation does not cover the biased conditions for DMWL[1:2]. One example is that DMWL's voltage can be treated as the same biased condition as the K−1 un-selected WLs in the selected string, block and plane. Only one WL is selected in the selected block for NAND data sensing. The un-selected blocks have to be disconnected from the global BLs and CSL[o] and CSL[e] lines to make sure there is no leakage to avoid wrong reading.

During the odd half-page sensing period, the even BLs act as BL shielding lines. Likewise, during the even half-page sensing period, the odd BLs act as BL shielding lines. All flash cells' MLC $V_t$s in the shielding strings and BLs are protected since the ramping up of the K−1 un-selected WLs from Vdd to 6V would also couple the channel voltage to a higher value near 6V that would cancel the WL's 6V of read gate disturb on the K−1 unselected WLs in the selected NAND string.

Figure 7:
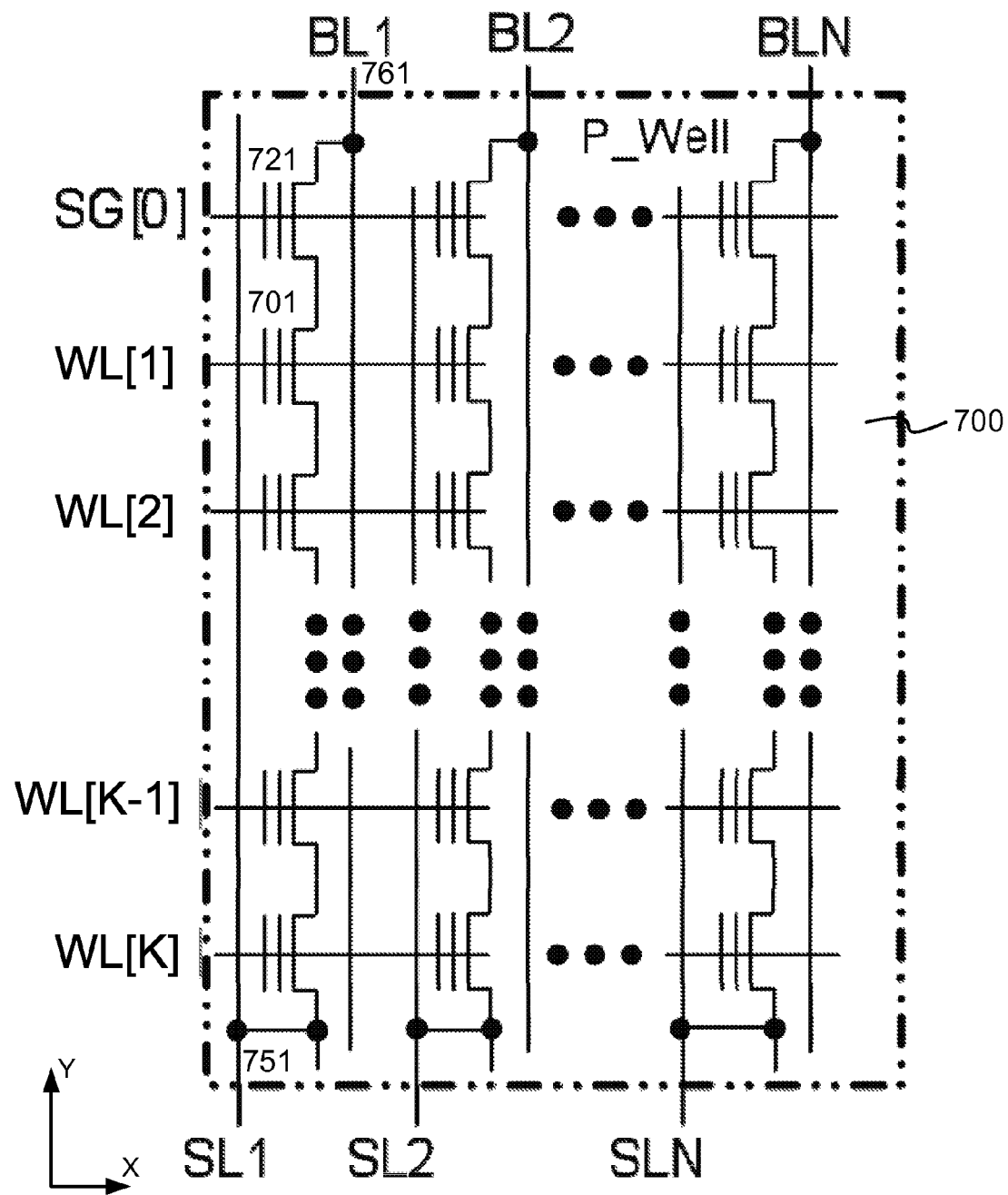
FIG. 7 is a schematic HiNAND block diagram according to an embodiment of the present invention.

FIG. 7 is a schematic HiNAND block diagram according to an alternative embodiment of the present invention. This diagram is merely an example, which should not unduly limit the scope of the claims herein. One of ordinary skill in the art would recognize other variations, modifications, and alternatives. Like conventional NAND, each HiNAND string 751 of the block 700 comprises K 2-poly floating-gate NMOS NAND transistors 701 connected in series without top and bottom 2-poly DMWLs and two 1-poly NMOS SG transistors (as shown in FIG. 5) placed on the top and bottom ends of the string. Instead, only one 2-poly flash cell 721 is inserted at the top of each HiNAND string. The gate of this added flash cell 721 is connected to gate signal SG[0] for controlling divided BL structure. The gate signal SG[0] can be treated as one select gate to control the corresponding block by shutting off the leakage current while sensing that the block has programmed patterns. In an embodiment, the threshold voltage level $V_t$ of the flash cells wired to SG[0] is set around 0.7V~1V.

Additionally unlike other NAND circuit, each HiNAND string 751 includes one-pair of vertical lines such as a local BL 761 (one of BL1 through BLN) and a local SL 751 (correspondingly one of SL1 through SLN) running in parallel in the Y-direction. In a specific embodiment, if K=32 each HiNAND string 751 has 33 flash cells connected in series with 32-bit storage. In another specific embodiment, if K=64 the HiNAND string 751 has 65 Flash cells connected in series. One advantage of this HiHAND block is that there is no need for including one pair of big NMOS devices of M[o] and M[e] as shown in FIG. 5 for each NAND string level. Thus vertical length of the HiNAND string is much shorter than that in prior art NAND string. During the read operation, the gate signal SG[0] is biased at Vdd level for the selected block but biased at Vss for the non-selected blocks.

Figure 8A:
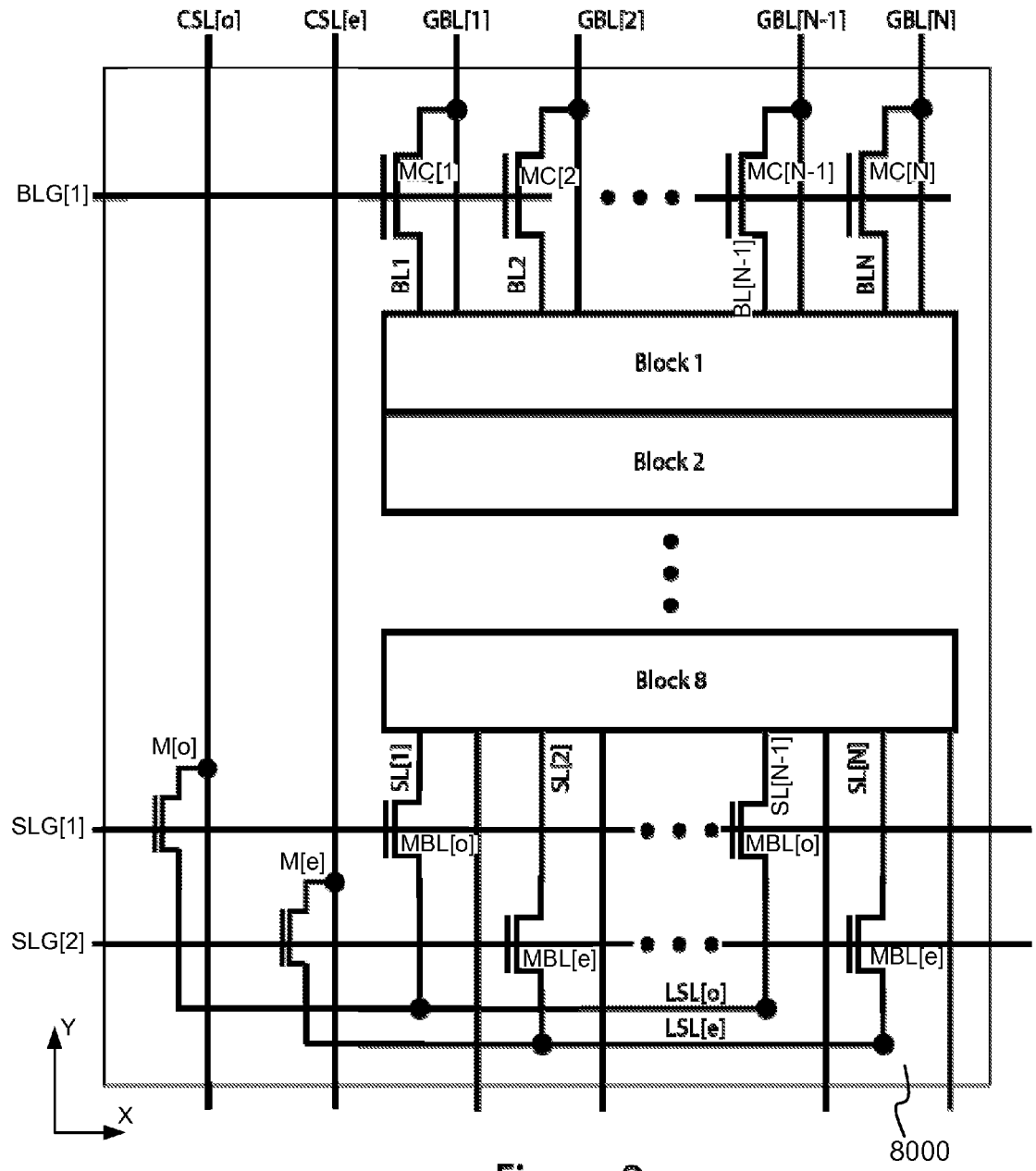
FIG. 8a is a schematic HiNAND sector diagram according to an embodiment of the present invention.

FIG. 8a is a schematic HiNAND sector diagram according to an embodiment of the present invention. This diagram is merely an example, which should not unduly limit the scope of the claims herein. One of ordinary skill in the art would recognize other variations, modifications, and alternatives. As shown, the HiNAND sector 8000 with a size made of eight NAND blocks (1 through 8) placed sequentially in Y-direction. Each of these eight NAND blocks can be substantially the same one 700 shown in FIG. 7. The two global CSL lines are running vertically in the Y-direction and are in parallel to global BLs (GBL[1] through GBL[N]) shared by all the eight blocks. The BLG[1] decode line provides gate control for all GBLs through BL-select NMOS transistors MC[1] through MC[N] to couple with local bit lines (BL1 through BLN). Similar to FIG. 5, the two vertical global CSLs includes a CSL[o] and a CSL[e] respectively connect to drain nodes of two 1-poly NMOS BL-select transistors M[o] and M[e] gated by the SLG[1] and SLG[2] signal lines for controlling the coupling with the LSL[o] and LSL[e]. The LSL[o] and LSL[e] are respectively common for odd strings and even strings and further respectively coupled to each of the odd- and even-string local source lines via two half-rows of 1-poly NMOS SL-select transistors MBL[o] and MBL[e] gated also by the SLG[1] and SLG[2] respectively in X-direction. All the odd- and even-string local source lines are substantially the same as SL[1] through SL[N] as shown in FIG. 7 and respectively connected through all eight blocks (block 1 through block 8). Each string by itself within each individual block includes only K NAND flash cells plus an extra 2-poly flash cell without any top 1-poly NMOS SG transistors MC and bottom 1-poly NMOS SG transistors MBL (see FIG. 7). In other words, on top of all the eight blocks in the sector 8000 there is only one row of the SG transistors MC[1] through MC[N]. At the bottom of the eight blocks there is only one row of the SG transistors divided as MBL[o] for odd strings and MBL[e] for even strings. Thus vertical length of this HiNAND string is much shorter than that in prior art NAND string to save for cell area. In another specific embodiment, a bigger HiNAND sector size made of 16 or 32 blocks can be done as well to save more cell area.

During the odd half-page read operation, the biased conditions of all control signals of SLG[1] and SLG[2], CSL[o], CSL[e], WLs and BLG[1] are the same as in FIG. 5 of the present invention. The whole page read operation is similarly divided into four periods as explained for FIG. 5, that is, first three periods being associated with a first cycle (odd or even) half-page read operations and the fourth period being associated with a second cycle remaining (even or odd) half-page read operation. More details about the bias conditions associated with the two-cycle half-page read operation based on the HiNAND memory sector circuit shown in FIG. 8a can be found in later paragraphs of the specification including FIGS. 9-11.

Figure 8B:
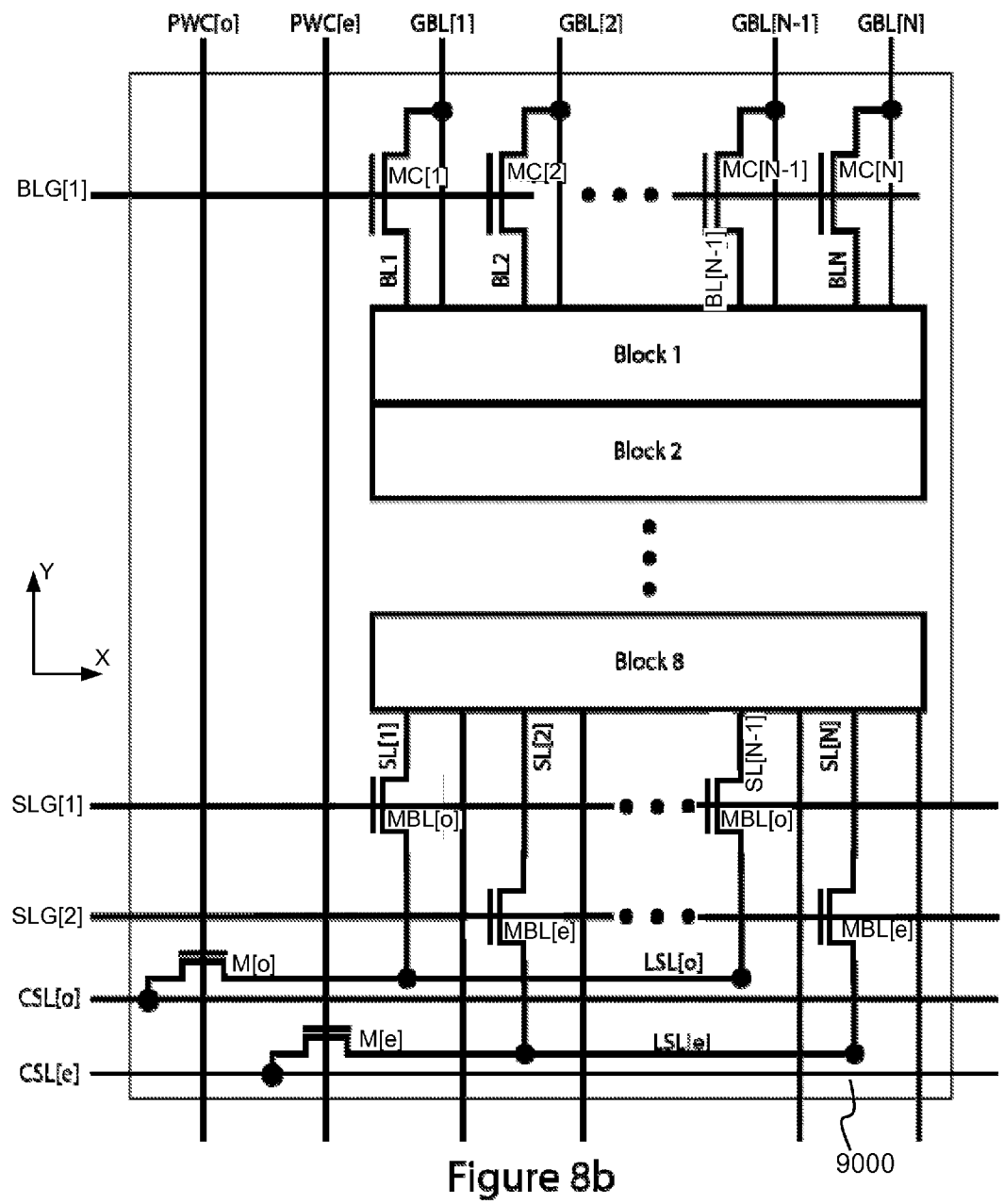
FIG. 8b is a schematic HiNAND sector diagram according to another embodiment of the present invention.

FIG. 8b is a schematic HiNAND sector diagram according to another alternative embodiment of the present invention. This diagram is merely an example, which should not unduly limit the scope of the claims herein. One of ordinary skill in the art would recognize other variations, modifications, and alternatives. As shown, the HiNAND sector 9000 includes a eight blocks placed side by side in the Y-direction sharing all global bit lines: GBL[1] through GBL[N]. Each GBL is coupled to a drain node of a top 1-ploy NMOS SG transistor MC gated by a common BLG signal in X-direction to link to local bit lines: BL[1] through BL[N] for each string through the whole sector 9000. Unlike FIG. 8a, the global CSL lines in this HiNAND sector 9000 run horizontally and are parallel to WLs in X-direction. Similar to FIG. 3, the horizontal CSL [o] and CSL[e] respectively connect to two 1-poly NMOS SG transistors M[o] and M[e] for coupling desired bias levels through controls of two PWC gate signals (PWC[o] and PWC [e]) to two divided local source lines: LSL[o] for odd strings and LSL[e] for even strings. The two PWC gate control lines are parallel to Y-direction. Similar to embodiment in FIG. 8a, the LSL[o] and LSL[e] are respectively coupled to odd and even string source lines SL[1] through SL[N] via 1-poly NMOS SL-select transistors MBL[o] and MBL[e] gated respectively by SLG[1] and SLG[2] in X-direction. Each string in individual block has eliminated top and bottom 1-poly NMOS SG transistors. In other words, all the eight blocks in the sector 9000 have only one row of top SG transistors MC[1] through MC[N] and one row of bottom SG transistors divided as MBL[o] for odd strings and MBL[e] for even strings. Thus vertical length of this HiNAND string is much shorter than that in prior art NAND string to save for cell area. In another specific embodiment, a bigger HiNAND sector size made of 16 or 32 blocks can be done as well to save more cell area.

Furthermore, a HiNAND plane can be made of a plurality of HiNAND sectors placed side by side in the Y-direction of the present invention. Each sector circuit can be made of either FIG. 8a or FIG. 8b. The page-based read operation of FIG. 8b would be similar to FIG. 8a except two control signals are PWC[o] and PWC[e] to replace CSL[o] and CSL [e]. Thus, the detailed explanation will be skipped here without affecting the spirit of the present invention.

Figure 9:
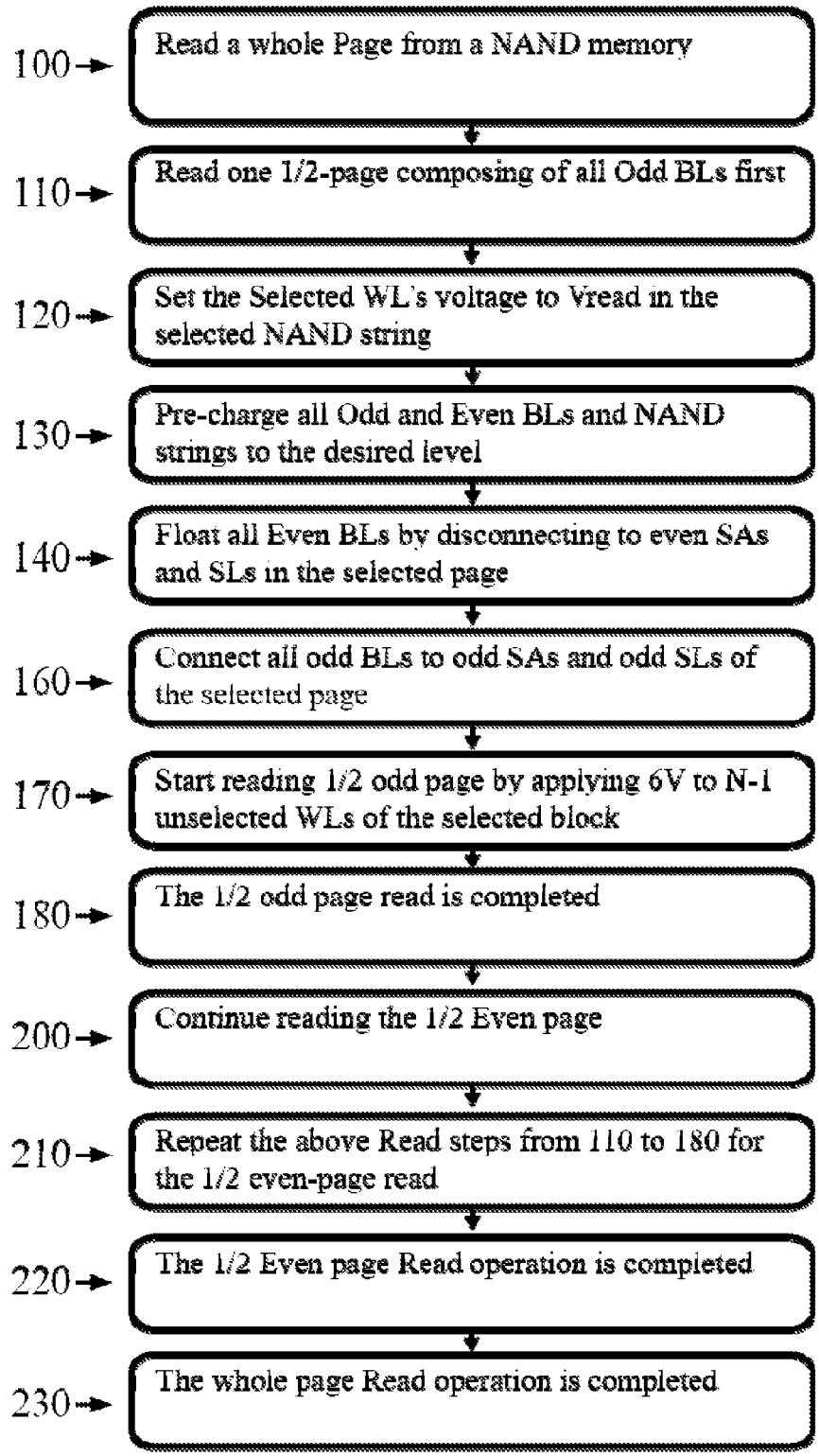
FIG. 9 is a flow of a preferable Read operation in units of block according to an embodiment of the present invention.
Figure 10:
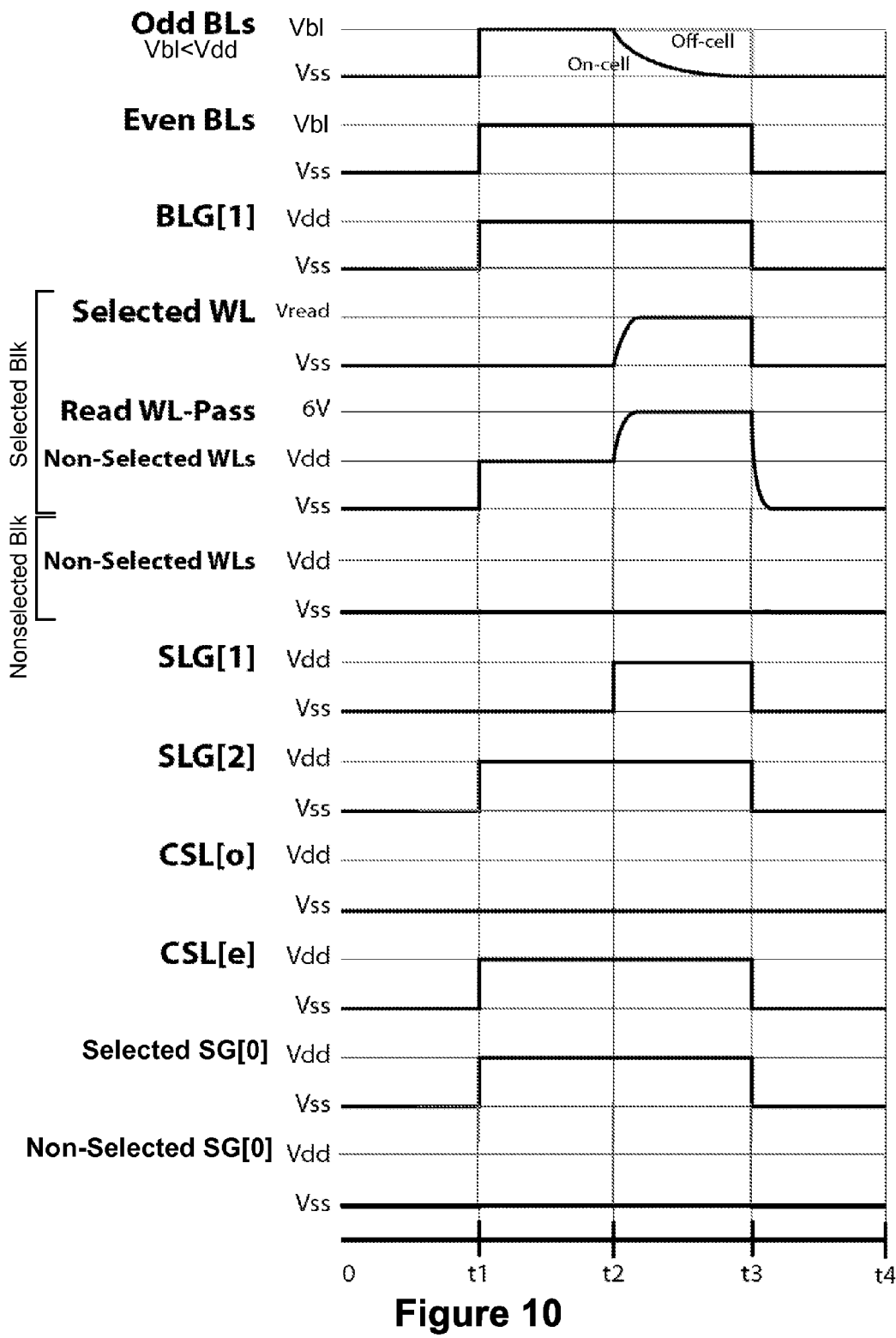
FIG. 10 is preferable timeline for the first half-page odd BL sensing in accordance with the NAND Block circuit shown in FIG. 8a according to an embodiment of the present invention.
Figure 11:
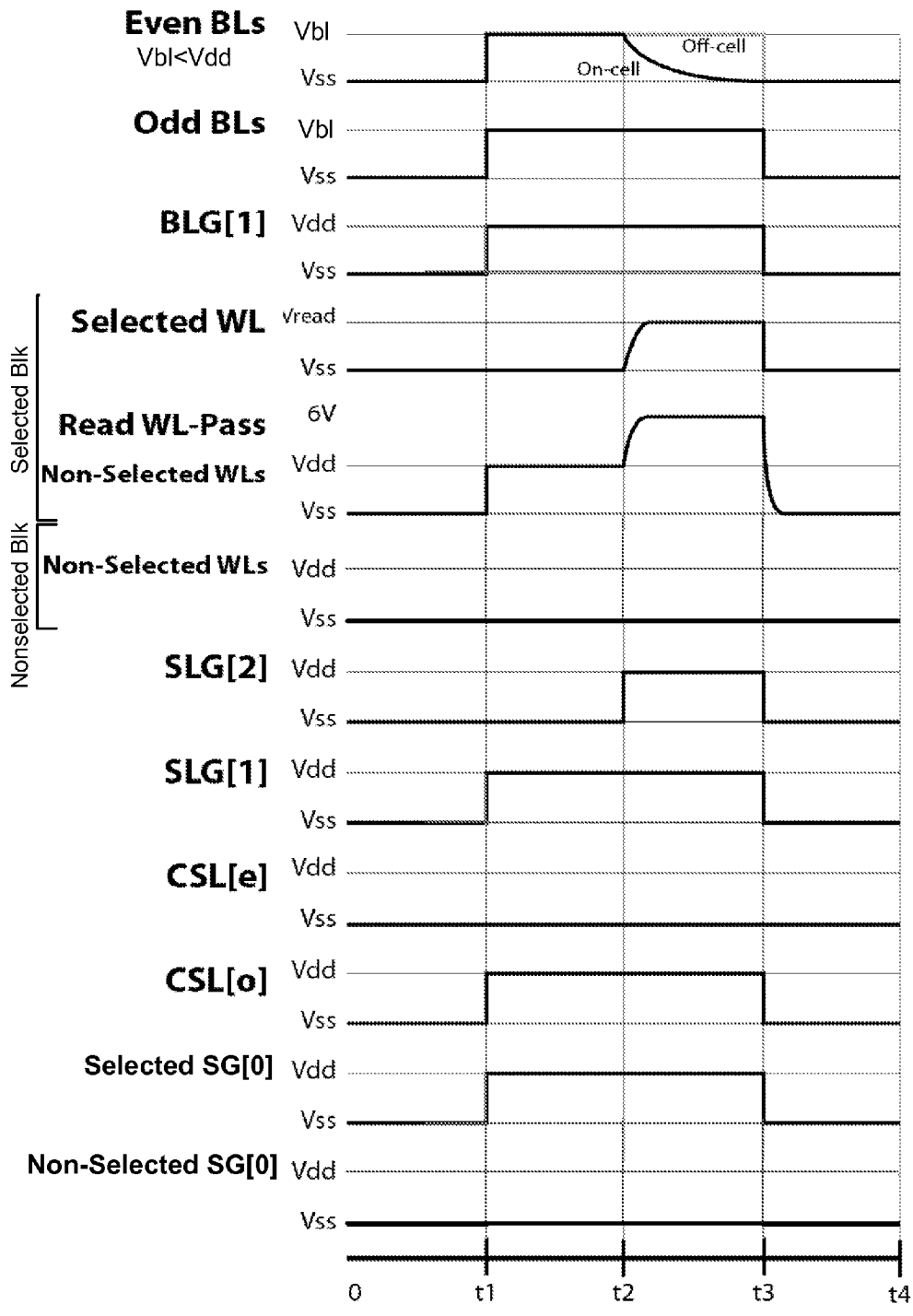
FIG. 11 is preferable timeline for the second half-page even BL sensing in accordance with the NAND Block circuit shown in FIG. 8a according to an embodiment of the present invention.

FIG. 9 is a flow of a preferable read operation in units of block according to an embodiment of the present invention. This diagram is merely an example, which should not unduly limit the scope of the claims herein. One of ordinary skill in the art would recognize other variations, modifications, and alternatives. As explained above, the single page-read operation is preferably divided into two half-page read with another half-page acting as a BL shielding protection. Each half-page read operation is divided into three steps or three periods. The flow of the two-cycle three-step read operation is further referred in FIG. 10 and FIG. 11 in later section of the specification. FIG. 10 is preferable timeline for the first half-page odd BL sensing in accordance with the HiNAND block circuit shown in FIG. 8a according to an embodiment of the present invention. FIG. 11 is preferable timeline for the second half-page even BL sensing in accordance with the HiNAND block circuit shown in FIG. 8a according to an embodiment of the present invention.

The read process flow is shown in FIG. 9. In box 100, it is indicated as a start for whole page read operation in the selected NAND plane. One WL associated with the page is selected in the selected NAND string along with K−1 non-selected WLs or pages in the selected block. The vertical M−1 unselected NAND blocks in the selected NAND plane are disconnected from global BLs by turning off the gate signal BLG[1]. This is the period shown between 0 to t1 shown in FIG. 10. In that period, all the control signals with conditions of SLG[1]=SLG[2]=BLG[1]=CSL[o]=CSL[e]=Vss, selected WL, non-selected WL, and SG[0] in the selected NAND block are set at Vss, All WL[1] to WL[K] of other non-selected NAND blocks are set at floating or at Vss, and SG[0] for selected or nonselected blocks is set to Vss.

In a specific embodiment, the read operation as shown in box 110 is first to read the data from a first half-page (e.g., odd) NAND strings of the selected page in the selected NAND block in the selected NAND plane. In other words, only the N/2 odd flash cells in the N/2 odd NAND strings are selected first for sensing. Next, the sensing operation for reading N/2 odd strings breaks into more sub-steps. The box 120 shows that a sub-step of the half-page read process is applied to set a preferable voltage Vread to the one selected WL, but let K−1 un-selected WLs of the selected block ramped to Vpass level and other unselected WLs in unselected blocks at Vss. The box 130 shows that another sub-step of the half-page read process is applied to pre-charge all odd and even BLs and NAND strings to a desired Vbl level. The details of the bias conditions of all related control signals are displayed in the second period between t1 to t2 in FIG. 10. In that period, the control signals are set like: BLG[1]=Vdd, GBLs=Vbl, CSL[o]=SLG[1]=Vss, CSL[e]=SLG[2]=Vdd, selected WL is set to Vss, non-selected WLs of the selected block are set to Vdd, and all non-selected WLs in non-selected blocks remain at Vss, and SG[0] for selected block is set to Vdd while SG[0] for nonselected blocks is set to Vss.

For pre-charging all N/2 odd and N/2 even BLs and N NAND strings within the selected NAND plane, the longest BLs with the length across all vertical blocks are pre-charged to Vbl. But only the short N/2 even NAND strings within one selected block are also pre-charged from the bottom of the NAND string through one horizontal pair of local source lines LSL[o] and LSL[e] as seen in FIG. 8a coupled with another vertical pairs of common source lines CSL[o] and CSL[e]. The N/2 odd BLs are still pre-charged. But the short N/2 odd NAND strings do not need to be pre-charged from the strings' bottom source nodes. The pre-charge still flows into the selected odd NAND string from BL but is blocked by the selected WL voltage at Vss (or grounded).

Next, the read operation moves to another sub-step shown in box 140, which is defined as the even BL floating period within the selected NAND plane. All N/2 even BLs and all N/2 even strings in the selected block have to be kept at initial pre-charged BL voltage Vbl without any leakage, to act as the shielding BLs. In other words, all N/2 even BLs and N/2 even NAND strings are set equivalent to the floating state in this period.

Next, the half-page read operation moves to yet another sub-step shown in box 160, which is defined as the all N/2 odd BLs setup period. In this period, all N/2 odd BLs and N/2 odd NAND strings within the selected NAND block and plane are connected to global N/2 odd BLs and PGM page buffer on top of the NAND array. The bottom of the N/2 odd NAND strings within the selected block are connected to Vss level through a horizontal pair of local source lines LSL[o] and LSL[e] or another vertical pair of common source lines CSL[o] and CSL[e] as shown in FIGS. 5 and 8a. This is a preparation period before the half-page data sensing on all odd NAND strings in the selected block within the selected NAND plane.

Additionally, the half-page read operation moves to still another sub-step shown in box 170, which is defined as the half-page data sensing period, t2 to t3, as seen in FIG. 10, for the N/2 odd NAND strings within the selected block. In this period, a Vread voltage is applied to the selected WL in the selected block and 6V of WL-pass voltage Vpass is applied to all K−1 non-selected WLs in the selected block of the NAND plane. All other K WLs in the non-selected blocks are either set to be floating or at Vss without causing WL-gate disturbance to the unselected NAND flash cells in the unselected blocks in the NAND plane. The selected odd BLs' voltage would be retained at initial pre-charged Vbl level if the selected cells' $V_t$s are above the Vread level. But the selected odd BLs' voltage would be discharged to Vss level if the selected cells' $V_t$s are below the Vread level. In other words, the final odd BLs' voltages after half-page sensing during t2-t3 period are determined by the data pattern stored in the PGM page buffer. The final correct read-out data would be stored in the odd half-page of PGM buffer after t3.

Due to the N/2 even BLs' shielding protection, the N/2 odd NAND strings' data sensing would be very reliable without the concern of an adjacent BL-induced noise coupling effect.

Next, the half-page read operation moves to still yet another sub-step shown in box 180. Once the N/2 half-page odd flash data are sensed successfully and latched into N/2 odd bits of PGM page buffer, then the first half-page odd NAND string read operation of single NAND page is completed.

Subsequently, the page read operation moves to box 200. Once the first N/2 half-page odd string read is completed, the page read operation moves to read the second N/2 half-page of even NAND strings of the selected page of the selected block within the selected NAND plane. Of course, there is no preference to choose to read odd or even half-page first.

Next, the page read operation moves to box 210, which is defined as the second half-page sensing period for N/2 even NAND strings within the selected page and block and NAND plane. Meanwhile, all N/2 odd BLs now act as the shielding BLs for sensing N/2 even BLs. In this period, a Vread level is applied to the selected WL and a 6V of WL-pass voltage Vpass is applied to all K−1 non-selected WLs in the selected block of the selected NAND plane. All other K WLs in the non-selected blocks are similarly either set to be floating without having any WL-gate disturbance to the unselected NAND flash cells in the unselected WLs in the unselected M−1 blocks in the selected NAND plane. Similarly, the selected even BLs' voltage would be retained at initial pre-charged BL voltage Vbl if the selected cells' $V_t$s are above the Vread level and would be discharged to Vss if the selected cells' $V_t$s are below Vread level. The details of second N/2 even NAND strings' read operation are shown in FIG. 11 corresponding to NAND sector circuit in FIG. 8a. The major changes in the control signals are the voltages swapped between odd and even control signals.

Due to the N/2 odd BLs' shielding protection, the N/2 even NAND strings' data sensing would be very reliable without the concern of BL-noise coupling effect.

Furthermore, the page read operation moves to box 220, which is defined as the half-page sensing period for N/2 even NAND strings within the selected block and plane. Once the N/2 half-page even strings data are successfully sensed and latched into the N/2 even bits of PGM page buffer, this even half-page read operation is completed.

Moreover, the page read operation moves to box 230, which is defined as the whole page sensing period. After this period, the whole page of selected flash MLC $V_t$s are successfully sensed and then latched into whole page of PGM buffer by the two-cycle read operation. In each cycle of half-page read operation, there are 4 successive $V_t$s sensing for MLC read. The speed of the two-cycle half-page MLC read operation of the present invention is halved compared to the traditional 1-cycle NAND's MLC read but guarantees accurate data sensing.

Lastly, the same approach of half-page of shielding effect can be preferably applied to the program and program-inhibit operation in FIG. 5, FIG. 6, FIG. 7, and FIG. 8a NAND planes of the present invention.

The difference is that the WL-pass voltage in read operation is about 6.0V but in program operation is about 10V. The WL-read voltage is set between four $V_t$ levels of a MLC cell. But in program operation, the WL-program voltage is set to be 20V to induce the FN-tunneling effect to increase the flash cell's MLC $V_t$s. During the N/2 odd NAND strings program, the N/2 even NAND strings have to retain the pre-charged BL voltage, which is about 7V for program operation, not at Vbl<Vdd as in page read operation. In this way, the N/2 half-page even NAND strings would provide the shielding effect over N/2 half-page odd BL for programming. As a result, both non-reliable 1-cycle LSBPI and GSBPI schemes can be replaced by the 2-cycle non-boosting program-inhibit approach for NAND nodes below 3×nm.

In a specific embodiment, the present invention provides a NAND memory block circuit for two-cycle half-page read operation. The NAND memory block circuit includes a NAND cell array comprising a plurality of memory cells built in a common P-well region and arranged as multiple pages in rows in x-direction and multiple strings in columns in y-direction. Each page of memory cells is associated with a word line in the x-direction and each string of memory cells is associated with a bit line in the y-direction. The x-direction is perpendicular to the y-direction. In a specific embodiment, the NAND memory block circuit is schematically depicted as a NAND block 500 in FIG. 5. The memory block circuit further includes a first string decoder located at one end of the multiple strings (551 etc.). The first string decoder includes a row of 1-poly NMOS select-gate transistors DST1 having a first common gate input BLG[1] and respectively connecting drain nodes to the bit lines BL[1] through BL[N] of corresponding strings.

Additionally, the memory block circuit includes a second string decoder located at another end of the multiple strings (see FIG. 5). The second string decoder includes a first half-row of odd-column 1-poly NMOS select-gate transistors MBL[o] plus a first extra 1-poly NMOS select-gate transistor M[o] and a second half-row of even-column 1-poly NMOS select-gate transistors MBL[e] plus a second extra 1-poly NMOS select-gate transistor M[e]. As shown in FIG. 5, the first and second half-row of odd/even-column 1-poly NMOS select-gate transistors are respectively gated by a second common gate input SLG[1] and a third common gate input SLG[2] for associating all odd-column strings 551 and even-column strings 552 with an odd group local source line LSL[o] and an even group local source line LSL[e] laid in the x-direction. The first extra 1-poly NMOS select-gate transistor M[o] and the second 1-poly NMOS select-gate transistor M[e] are also respectively gated by the second common gate input SLG[1] and the third common gate input SLG[2] to control a coupling of an odd common source line CSL[o] in the y-direction with the LSL[o] in the x-direction and a coupling of an even common source line CSL[e] in the y-direction and the LSL[e] in the x-direction (see FIG. 5).

According to a specific embodiment, the first string decoder allows bit lines BL[1] through BL[N] of all odd-column and even-column strings being pre-charged to a bit line voltage Vbl in a pre-charge period of a half-page read operation. The second string decoder allows the N/2 bit lines of the odd-column strings in a selected page of the multiple pages being discharged in a data sensing period of the half-page read operation while the other N/2 bit lines of the even-column strings in the selected page are retained at the pre-charged bit line voltage Vbl so that the even-column strings will not be pulled down by the discharge of the odd-column strings to prevent the read of the odd-column strings from being affected by any coupling noise.

In another specific embodiment, the present invention provides a NAND memory plane circuit configured for performing a two-cycle half-page read operation substantially free from string coupling noise effect. The NAND memory plane circuit includes M NAND blocks arranged in series in y-direction sharing N global bit lines of BL1 through BLN respectively for N strings, an odd-string common source line CSL[o], and an even-string common source line CSL[e]. M and N are an even number greater than 2. In a specific embodiment, the NAND memory plane circuit is substantially the same as one plane circuit 600 depicted in FIG. 6.

Each NAND block is substantially the same memory block 500 shown as FIG. 5. The NAND block 500 includes a plurality of memory cells M1 arranged as K rows of pages in x-direction capped by two rows of dummy cells, DM1 and DM2, and the N columns of strings (such as 551 and 552) in the y-direction. Each page of memory cells is associated with a word line (WL) in the x-direction and each string of memory cells is associated with a local bit line (BL) in the y-direction. Each memory cell includes one 2-poly High-voltage floating gate transistor M1 with its channel aligned in the y-direction. The x-direction is perpendicular to the y-direction. The NAND block 500 further includes a first string decoder located at one end of the N strings. The first string decoder includes a row of 1-poly NMOS select-gate transistors DST1 having a first common gate input BLG[1] and respectively coupling the global bit lines BL1 through BLN to the local bit lines of corresponding strings.

Additionally, the NAND block 500 includes a second string decoder located at another end of the N strings. The second string decoder includes a first half-row of odd-column 1-poly NMOS select-gate transistors MBL[o] plus a first extra 1-poly NMOS select-gate transistor M[o] and a second half-row of even-column 1-poly NMOS select-gate transistors MBL[e] plus a second extra 1-poly NMOS select-gate transistor M[e]. The first/second half-row of odd/even-column 1-poly NMOS select-gate transistors MBL[o]/MBL[e] are respectively gated by a second/third common gate input SLG[1]/SLG[2] for associating all N/2 odd/even-column strings with an odd/even group local source line LSL[o]/LSL[e] in the x-direction. The first/second extra 1-poly NMOS select-gate transistor M[o]/M[e] is also gated by the second/third common gate input SLG[1]/SLG[2] to control a coupling between the odd/even-string common source line CSL[o]/CSL[e] in the y-direction and the odd/even group local source line LSL[o]/LSL[e] in the x-direction, as shown in FIG. 5.

Furthermore, the NAND memory plane circuit 600 includes an X-decoder circuit 630 configured to connect a plurality of row-data lines in the x-direction to the M NAND blocks (6001 through 600M). For each NAND block the plurality of row-data lines includes a top decoder line connected to the first common gate input BLG[1], a pair of bottom decoder lines respectively connected to the second common gate input SLG[1] and the third common gate input SLG[2], and K numbers of word lines (WL[1] through WL[K]) respectively connected to the K pages and a pair of dummy word lines (DMWL[1] and DMWL[2]) connected to the corresponding two dummy cells (DM1 and DM2). Moreover, the NAND memory plane circuit 600 includes a low-voltage SA&PGM buffer circuit 650 made from PMOS and NMOS devices with a power supply voltage Vdd and connected in the y-direction with the pair of common source lines CSL[o] and CSL[e] and all the global bit lines BL1 through BLN of the M NAND blocks.

According to a specific embodiment, the first string decoder allows local bit lines of all odd-column and even-column strings of all M NAND blocks being pre-charged to a bit line voltage Vbl in a pre-charge period of a half-page read operation. The bit line voltage Vbl is a bias level smaller than a power supply voltage Vdd and minus a threshold voltage level of a corresponding memory cell. The second string decoder allows the local bit lines of the odd-column strings in a selected page of a selected block of the M NAND blocks being discharged in a data sensing period of the half-page read operation. During the same data sensing period, the local bit lines of the even-column strings in the selected page of the selected block of the M blocks are retained at the pre-charged bit line voltage Vbl so that the local bit lines of even-column strings will not be pulled down by the discharge of the odd-column strings to prevent the read of the odd-column strings from being affected by any coupling noise.

In an alternative embodiment, the present invention provides a HiNAND memory sector circuit configured for a two-cycle half-page read scheme. The HiNAND memory sector circuit includes M HiNAND blocks arranged in series in y-direction sharing a common P-well region and N global bit lines of BL[1] through BL[N] respectively for N strings in the y-direction. M is selected from 8, 16, 32, and more. N is an integer number of memory bit size. In an embodiment, the HiNAND memory sector circuit is substantially the same as the memory sector 800 depicted in FIG. 8a, where M=8. In a specific embodiment, each of the M HiNAND blocks disclosed above is substantially the same memory block 700 depicted in FIG. 7. As shown, each HiNAND block 700 includes a plurality of memory cells 701 built in the common P-well region and arranged as K pages in rows in x-direction plus one extra row of 2-poly NMOS select-gate flash cells 721 and N strings 751 in the columns in the y-direction. Each page is associated with a word line WL. Each string is associated with a local source line SL and a local bit line BL. Each memory cell 701 includes one 2-poly NMOS floating gate transistor with its channel aligned in the y-direction. The x-direction is perpendicular to the y-direction. K is an integer selected from 32, 64, 128, and more.

The HiNAND memory sector circuit 800 further includes a pair of global source lines CSL[o] and CSL[e] laid in the y-direction. Additionally, the HiNAND memory sector circuit 800 shown in FIG. 8a includes a first string decoder located at one end of the 8 HiNAND blocks. The first string decoder includes a row of N 1-poly NMOS select-gate transistors (MC[1] through MC[N]) having a first common gate input BLG[1] and respectively connecting corresponding drain nodes to the N global bit lines (GBL[1] through GBL[N]) and corresponding source nodes to the N local bit lines (BL1 through BLN) through all the 8 HiNAND blocks. Furthermore, as shown in FIG. 8a, the HiNAND memory sector circuit 800 includes a second string decoder located at another end of the 8 HiNAND blocks. The second string decoder includes N/2 odd-column 1-poly NMOS select-gate transistors MBL[o] plus a first extra 1-poly NMOS select-gate transistor M[o] and N/2 even-column 1-poly NMOS select-gate transistors MBL[e] plus a second extra 1-poly NMOS select-gate transistor M[e]. The N/2 odd/even-column 1-poly NMOS select-gate transistors MBL[o]/MBL[e] are respectively gated by a second/third common gate input SLG[1]/SLG[2] for associating all N/2 odd/even-column strings with an odd/even group local source line LSL[o]/LSL[e] in the x-direction. The first/second extra 1-poly NMOS select-gate transistor M[o]/M[e] is also gated by the second/third common gate input to control a coupling between the global source line CSL[o]/CSL[e] in the y-direction and the odd/even group local source line LSL[o]/LSL[e] in the x-direction.

Additionally, the HiNAND memory sector circuit 800 is configured to couple with an X-decoder circuit having at least a first control line, 8 or more groups of word lines, a second control line, and a third control line laid in the x-direction. The first/second/third control line connects respectively with the first/second/third common gate input and each group of word lines including K word lines respectively connecting to K pages of memory cells and a SG[0] line connecting to the extra row of 2-poly NMOS select-gate flash cells 721 for each block (see FIG. 7) of the 8 or more HiNAND blocks.

In yet another alternative embodiment, stored data in each page of memory cells of a selected block of the 8 or more HiNAND blocks are read by performing a first cycle of odd/even-column half-page read operation and a second cycle of even/odd-column half-page read operation, each of the first cycle and the second cycle comprises a bias-condition setup period, a pre-charge period, and a data-sense period.

Figure 12A:
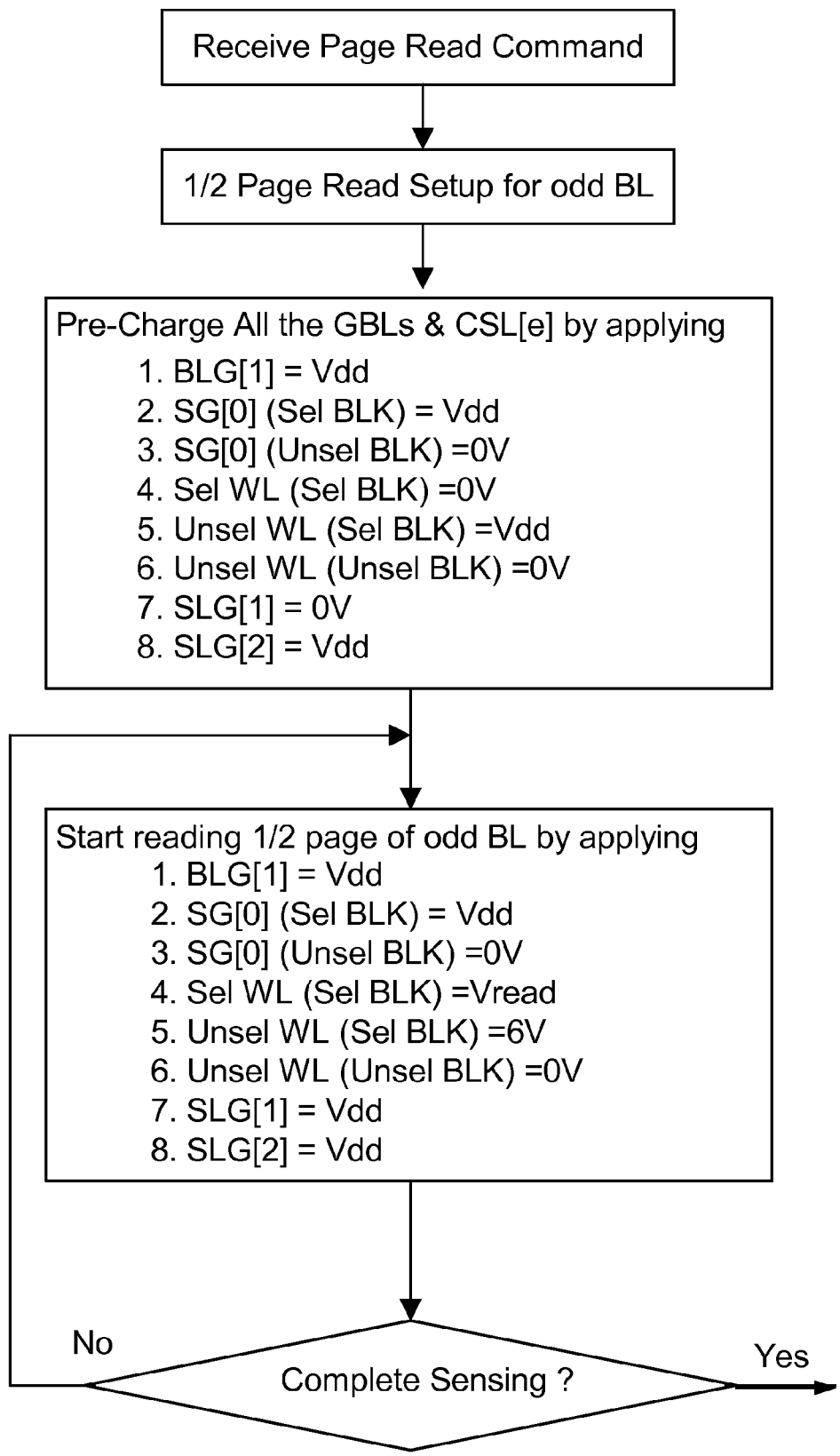
FIG. 12a and FIG. 12b are flow charts combined to show the two-cycle half-page read operation based on a HiNAND memory sector circuit according to a specific embodiment of the present invention.
Figure 12B:
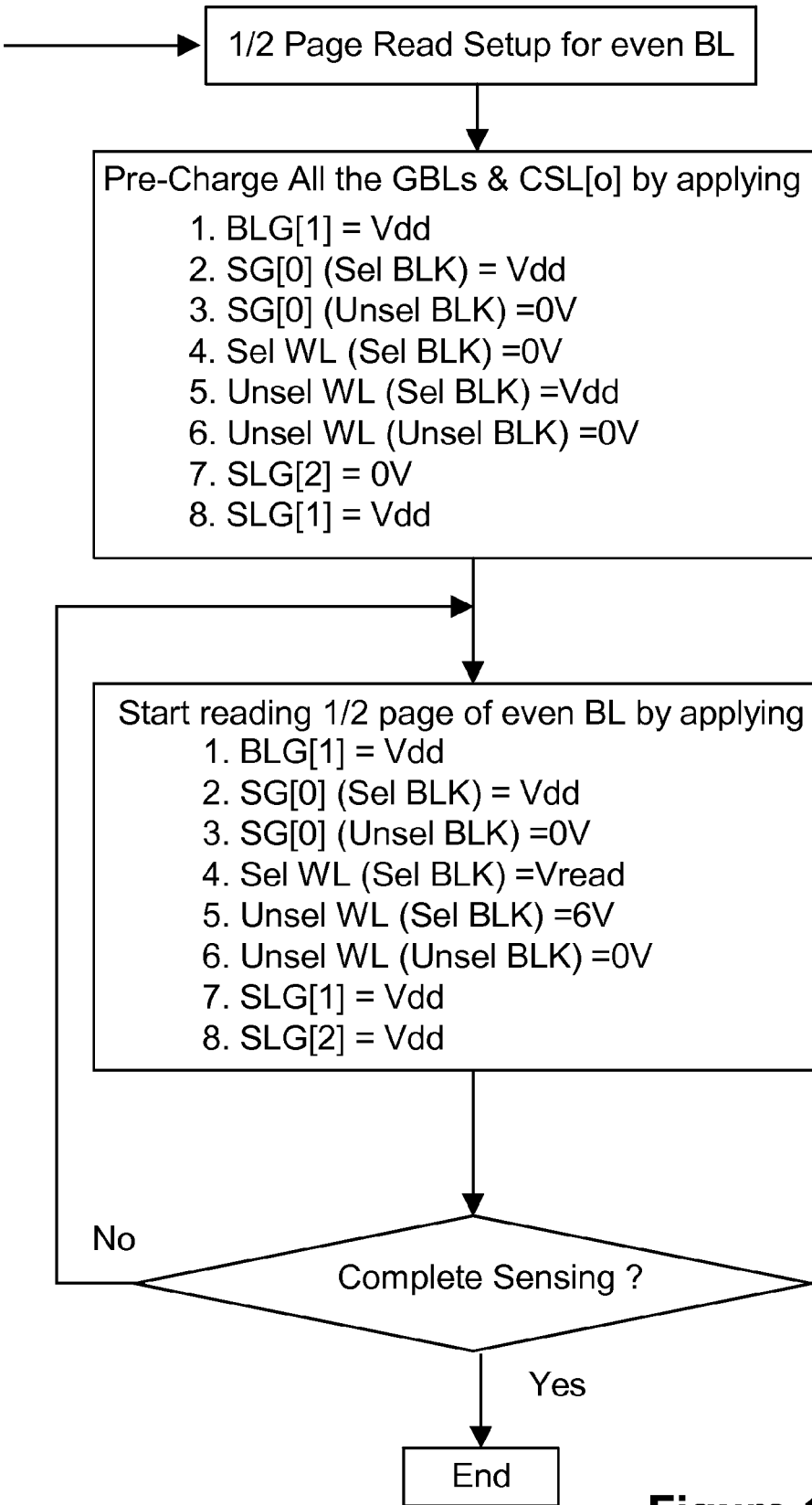

FIG. 12a and FIG. 12b are flow charts combined to show the two-cycle half-page read operation based on a HiNAND memory sector circuit (such as one described above in FIG. 8a) according to a specific embodiment of the present invention. This diagram is merely an example, which should not unduly limit the scope of the claims herein. One of ordinary skill in the art would recognize other variations, modifications, and alternatives. As shown in FIG. 12a, the HiNAND memory sector circuit receives a page read command to start a (whole) page read operation on a selected page in a selected block of the HiNAND memory sector. The whole page read operation is divided into two cycles and a first cycle operation is a half-page read operation designed to first read (for example) odd-column half-page. The first cycle half-page read operation includes at least three steps. A first step is to execute a half-page Read bias condition setup for all bit lines associated with odd-column strings, as shown in FIG. 12a. This step is also substantially depicted in period 0-t1 of timeline for the first half-page odd BL sensing in FIG. 10.

A second step is to execute a pre-charge step to charge all global bit lines and common source lines of the HiNAND sector. In order to do that, the following bias conditions for corresponding X-decoder control lines referring the FIG. 8a are implemented: BLG[1]=Vdd, SG[0] (for selected block)=Vdd, SG[0] (for unselected block)=0 V, selected WL=0 V, unselected WLs (for selected block)=Vdd, unselected WLs (for unselected blocks)=0 V, SLG[1]=0 V, and SLG[2]=Vdd. This step is also substantially depicted in period t1-t2 of timeline for the first half-page odd BL sensing in FIG. 10.

After the pre-charge step, all bit lines of the HiNAND memory sector can be charged to a preferred bit line voltage Vbl level. In a specific embodiment, the highest value of the Vbl is Vdd−$V_t$, $V_t$ is threshold voltage level of a corresponding memory cell. Then, a third step is execute to start read the half-page of odd-column bit lines by applying the following bias conditions for corresponding X-decoder control lines: BLG[1]=Vdd, SG[0] (for selected block)=Vdd, SG[0] (for unselected block)=0 V, selected WL=Vread, unselected WLs (for selected block)=6 V, unselected WLs (for unselected blocks)=0 V, SLG[1]=Vdd, and SLG[2]=Vdd. Note, the Vread is a read voltage level corresponding to four values: Vr0=0V, Vr1=1.5V, Vr2=2.5V, and Vr3=3.5V, applied to a selected multi-level memory cell having corresponding four threshold voltage levels of $V_t0$ of −2.0 V, $V_t1$ of ~1V, $V_t2$ of ~2V, and $V_t3$ of ~3V. This step is also substantially depicted in period t2-t3 of timeline for the first half-page odd BL sensing in FIG. 10.

A complete half-page read operation includes an associated data sensing process. During the process, according to an embodiment, the odd-column strings in a selected page of the K pages of a selected block of the 8 or more HiNAND blocks can be discharged to 0V if the threshold voltage level of the selected memory cell is below the Vread level applied thereto. While at the same time, the even-column strings in the selected page are retained at the pre-charged bit line voltage Vbl due to the bias setup and pre-charge steps based on the proposed HiNAND sector circuit design (see FIG. 8a). Therefore, the bit lines of the even-column strings will not be pulled down by the discharge of the odd-column strings. This effectively prevents the read of bit lines of the odd-column strings from being affected by any coupling noise. The data sensing should complete as shown in the period t3-t4 of timeline for the first half-page odd BL sensing in FIG. 10. This period is also substantially depicted in period 0-t1 of timeline for the second half-page even BL sensing in FIG. 11.

Once the data sensing is complete, the first cycle read operation is complete and moves to the second cycle as shown in FIG. 12b. Essentially, the second cycle is a repeat of the three-step half-page read operation applied to the half-page of remaining even-column strings. The first step of the second cycle is also a half-page Read setup for bit lines of even-column strings, substantially shown in period 0-t1 of timeline of FIG. 11. Following that, a pre-charge step is executed to charge all bit lines of global bit lines and common source lines by applying the X-decoder control biases: BLG[1]=Vdd, SG[0] (for selected block)=Vdd, SG[0] (for unselected block)=0 V, selected WL=0 V, unselected WLs (for selected block)=Vdd, unselected WLs (for unselected blocks)=0 V, SLG[1]=Vdd, and SLG[2]=0 V. This period is also substantially depicted in period t1-t2 of timeline for the second half-page even BL sensing in FIG. 11.

After the pre-charge step, all bit lines of the HiNAND memory sector can be charged to a preferred bit line voltage Vbl level. Then, a third step is execute to start read the half-page of even-column bit lines by applying the following bias conditions for corresponding X-decoder control lines: BLG[1]=Vdd, SG[0] (for selected block)=Vdd, SG[0] (for unselected block)=0 V, selected WL=Vread, unselected WLs (for selected block)=6 V, unselected WLs (for unselected blocks)=0 V, SLG[1]=Vdd, and SLG[2]=Vdd. This period is also substantially depicted in period t2-t3 of timeline for the second half-page even BL sensing in FIG. 11.

Again, a data sensing is performed during which the even-column strings in a selected page of the K pages of a selected block of the 8 or more HiNAND blocks can be discharged to 0V if the threshold voltage level of the selected memory cell is below the Vread level applied thereto. While at the same time, the odd-column strings in the selected page are retained at the pre-charged bit line voltage Vbl due to the bias setup and pre-charge steps based on the proposed HiNAND sector circuit design (see FIG. 8a). Therefore, the bit lines of the odd-column strings will not be pulled down by the discharge of the even-column strings. This effectively prevents the read of bit lines of the even-column strings from being affected by any coupling noise.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A HiNAND memory sector circuit configured for a two-cycle half-page read scheme, the HiNAND memory sector circuit comprising:

M HiNAND blocks arranged in series in y-direction sharing a common P-well region and N global bit lines of BL[1] through BL[N] respectively for N strings in the y-direction, M being selected from 8, 16, 32, and more, N being an integer number of memory bit size, each HiNAND block comprising:

a plurality of memory cells built in the common P-well region and arranged as K pages in rows in x-direction plus one extra row of 2-poly NMOS select-gate flash cells and N strings in the columns in the y-direction, each page being associated with a word line, each string being associated with a local source line and a local bit line, each memory cell including one 2-poly NMOS floating gate transistor with its channel aligned in the y-direction, the x-direction being perpendicular to the y-direction, K being an integer selected from 32, 64, 128, and more;

a pair of global source lines CSL[o] and CSL[e] laid in the y-direction;

a first string decoder located at one end of the M HiNAND blocks, the first string decoder comprising a row of N 1-poly NMOS select-gate transistors having a first common gate input and respectively connecting corresponding drain nodes to the N global bit lines BL[1] through BL[N] and corresponding source nodes to the N local bit lines through all the M HiNAND blocks; and a second string decoder located at another end of the M HiNAND blocks, the second string decoder comprising N/2 odd-column 1-poly NMOS select-gate transistors plus a first extra 1-poly NMOS select-gate transistor and N/2 even-column 1-poly NMOS select-gate transistors plus a second extra 1-poly NMOS select-gate transistor, the N/2 odd/even-column 1-poly NMOS select-gate transistors being respectively gated by a second/third common gate input for associating all N/2 odd/even-column strings with an odd/even group local source line LSL[o]/LSL[e] in the x-direction, the first/second extra 1-poly NMOS select-gate transistor being also gated by the second/third common gate input to control a coupling between the global source line CSL[o]/CSL[e] in the y-direction and the odd/even group local source line LSL[o]/LSL[e] in the x-direction;

wherein the first string decoder allows the N local bit lines of all odd-column and even-column strings of all the M HiNAND blocks being pre-charged to a bit line voltage Vbl in a pre-charge period of a half-page read operation and the second string decoder allows the odd-column strings in a selected page of the K pages of a selected block of the M HiNAND blocks being discharged in a data sensing period of the half-page read operation while the even-column strings in the selected page being retained at the pre-charged bit line voltage Vbl so as not be pulled down by the discharge of the odd-column strings to prevent the read of the odd-column strings from being affected by any coupling noise.

2. The HiNAND memory sector circuit of claim 1 further comprises an X-decoder circuit including at least a first control line, M groups of word lines, a second control line, and a third control line laid in the x-direction, the first/second/third control line connecting the first/second/third common gate input and each group of word lines including K word lines respectively connected to K pages of memory cells and a SG[0] line connected to the extra row of 2-poly NMOS select-gate flash cells for each block of the M HiNAND blocks.

3. The HiNAND memory sector circuit of claim 1 further comprises a low-voltage SA&PGM buffer circuit made from PMOS and NMOS devices with a power supply voltage Vdd, the low-voltage SA&PGM buffer circuit including least N+2 control lines in the y-direction respectively connected to the pair of global source lines CSL[o] and CSL[e] and all the N global bit lines BL[1] through BL[N] of the M HiNAND blocks.

4. The HiNAND memory sector circuit of claim 1 wherein the bit line voltage Vbl is a bias level smaller than a power supply voltage Vdd level minus a threshold voltage level of a corresponding memory cell.

5. The HiNAND memory sector circuit of claim 1 wherein each page of memory cells of a selected block of the M HiNAND blocks is read by performing a first cycle of odd/even-column half-page read operation and a second cycle of even/odd-column half-page read operation, each of the first cycle and the second cycle comprises a bias-condition setup period, a pre-charge period, and a data-sense period.

6. The HiNAND memory sector circuit of claim 5 wherein the bias-condition setup period for reading an odd-column half-page in the selected page of the selected block is associated with a first set of predetermined bias conditions including:

the Vdd level applied to the first common gate input;
a Vss=0V set for all K word lines including a corresponding SG[0] line in the selected block;
the Vss level set for all word lines including corresponding SG[0] lines of all M−1 unselected blocks;
the Vss level set for all the N global bit lines;
the Vss level set for the second common gate input;
the Vdd level applied to the third common gate input; and
the Vss level set for the pair of global source lines CSL[o] and CSL[e].

7. The HiNAND memory sector circuit of claim 6 wherein the pre-charge period for reading an odd-column half-page in the selected page in the selected block further is associated with a second set of predetermined bias conditions including:

the Vdd level applied to the first common gate input;
0 V applied to the selected word line associated with the selected page of the selected block;
the Vdd level applied to all K−1 non-selected word lines including the corresponding SG[0] line in the selected block;
the Vss level set for all word lines including the corresponding SG[0] lines in the M−1 unselected blocks;
the Vbl level applied to all the N global bit lines for charging both the local bit lines associated with N/2 odd-column strings and N/2 even-column strings, the Vbl level being smaller than the Vdd level;
the Vss level set for the second common gate input;
the Vdd level applied to the third common gate input;
the Vss level set for one of the pair of global source lines: CSL[o]; and
the Vdd level applied to another one of the pair of global source lines: CSL[e].

8. The HiNAND memory sector circuit of claim 7 wherein data-sensing period for reading an odd-column half-page in the selected page in the selected block further is associated with a third set of predetermined bias conditions including:

the Vdd level applied to the first common gate input;
a read voltage Vread level applied to the selected word line in the selected block;
a pass voltage Vpass level applied to all the K−1 non-selected word lines in the selected block, the Vpass level being set to 6.0V;
the Vdd level applied to the SG[0] line in the selected block;
the Vss level set for all word lines including the corresponding SG[0] lines in the M−1 unselected blocks;

the Vbl level kept at the N/2 global bit lines associated with the odd-column strings and further at corresponding N/2 local bit lines if a threshold voltage level of the selected cells is above the Vread level, or 0 V level discharged at the N/2 global bit lines associated with the odd-column strings and further at corresponding N/2 local bit lines if the threshold voltage level of the selected cells is below the Vread level;

the Vbl level kept at the N/2 global bit lines associated with even-column strings and further at the corresponding N/2 local bit lines;

the Vdd level applied to both the second common gate input and the third common gate input;

the Vss level set to the CSL[o]; and the Vdd level applied to the CSL[e].

9. The HiNAND memory sector circuit of claim 5 wherein the bias-condition setup period of the second cycle of even/odd-column half-page read operation substantially follows the data sensing period of the first cycle of odd/even-column half-page read operation.

10. The HiNAND memory sector circuit of claim 8 wherein the read voltage Vread corresponds to one of four voltage levels: Vr0=0V, Vr1=1.5V, Vr2=2.5V, and Vr3=3.5V, applied to a selected multi-level memory cell having corresponding four threshold voltage levels of $V_t0$ of −2.0V, $V_t1$ of ~1V, $V_t2$ of ~2V, and $V_t3$ of ~3V.

11. The HiNAND memory sector circuit of claim 8 wherein the Vss level at the odd-column common source lines allows the odd group local source line at low for potentially discharging the local bit lines of the odd-column strings to 0V for reading stored data in the half-page memory cells associated with the selected word line and corresponding odd-column local bit lines, and the Vdd level at the even-column common source line is coupled to the even group local source line for retaining the local bit lines of the even-column strings at the Vbl level to induce a shielding effect for preventing a false-read of the odd-column strings.

* * * * *